June 18, 1957 F. PAPOUSCHEK 2,796,519

TUNING DEVICE

Filed Jan. 30, 1956 7 Sheets-Sheet 1

INVENTOR.
FRANZ PAPOUSCHEK
BY F. A. Reckif
ATTORNEY

June 18, 1957 F. PAPOUSCHEK 2,796,519

TUNING DEVICE

Filed Jan. 30, 1956 7 Sheets-Sheet 2

INVENTOR.
FRANZ PAPOUSCHEK
BY F. A. Rechif
ATTORNEY

June 18, 1957 F. PAPOUSCHEK 2,796,519

TUNING DEVICE

Filed Jan. 30, 1956 7 Sheets-Sheet 3

INVENTOR.

FRANZ PAPOUSCHEK

BY F. A. Rechif

ATTORNEY

INVENTOR.
FRANZ PAPOUSCHEK
BY G. A. Rechif
ATTORNEY

INVENTOR.
FRANZ PAPOUSCHEK
BY F.A. Rechif
ATTORNEY

INVENTOR.
FRANZ PAPOUSCHEK
BY F. A. Rechif
ATTORNEY

June 18, 1957 F. PAPOUSCHEK 2,796,519

TUNING DEVICE

Filed Jan. 30, 1956 7 Sheets-Sheet 7

INVENTOR.
FRANZ PAPOUSCHEK
BY F. A. Rechif
ATTORNEY

United States Patent Office 2,796,519

Patented June 18, 1957

2,796,519

TUNING DEVICE

Franz Papouschek, Pointe Claire, Quebec, Canada, assignor to Radio Corporation of America, a corporation of Delaware Application January 30, 1956, Serial No. 562,293

14 Claims. (Cl. 250—20)

This invention relates to a tuning device, and more particularly to a tuning device for a multiband communications receiver providing continuous coverage over a wide frequency range, such as from 70 kilocycles (kc.) to 28 megacycles (mc.).

The problem of uni-controlled adjustment of a plurality of tunable devices is old in the receiver art, and is encountered in all superheterodyne receivers where it is necessary to accomplish simultaneous tuning of radio frequency (R. F.) selectors and of the heterodyne oscillator while maintaining a preselected frequency relation between the tunable stages over the desired range of operating frequencies. Usually, such of the tunable stages has a principal tuning reactance, such as a variable inductor or capacitor, and the uni-control system adjusts these reactances. In most instances, however, this sort of arrangement provides the precise frequency relation of the tunable stages over but a small portion of the operating range and it is necessary to resort to the use of trimmer and/or padder condensers in an effort to achieve tracking, that is, a relatively fixed frequency relation of the tunable stages over the entire operating range.

This problem of tracking is particularly acute in the case of wide range multiband receivers, wherein a plurality of tuning reactances must be switched into the circuit selectively and each and every one of these reactances must be made to track, if continuous coverage of the tuning range is desired. In the past, various solutions of this problem of tracking over a very wide frequency range have been attempted, with rather poor results. Some known arrangements use planetary or other complicated gearing arrangements. However, these arrangements are complicated and expensive to manufacture and leave something to be desired in the way of resettability, since with such arrangements considerable backlash is present in the gearing.

An object of this invention is to devise a novel mechanical tuning arrangement for multiband receivers which is considerably simpler than those of the prior art.

Another object is to provide a novel mechanical tuning arrangement operating by direct drive, in which backlash is completely eliminated.

A further object is to devise a novel tuning arrangement for multiband receivers, in which the tuning and switching features (for switching among different tuning reactances) are mechanically separated, one from the other.

The objects of this invention are accomplished, briefly, in the following manner: A plurality of movable tuning elements (permeability or magnetic core tuning elements) for tuning radio apparatus such as a receiver are mechanically coupled to an elongated member, for example a rocker plate. The two ends of this elongated member are independently movable and adjustable with respect to a fixed support by separate mechanisms operated respectively from a band switch shaft and from a tuning shaft. The tuning elements are connected into different portions of the radio receiver; for example, the antenna coupling, R. F. amplifier and oscillator portions, and the movable portions of the tuning elements move with the elongated member, to tune the radio receiver. A range switch is operated intermittently from the band switch shaft, to selectively switch into the various circuits different ones of the tuning elements. A harmonic selector switch in a frequency control unit is operated from the band switch shaft, to select a certain harmonic frequency for locking-in the local heterodyne oscillator in frequency. The tuning shaft also tunes certain elements in the control unit, to aid in the locking-in of the local oscillator frequency at the proper value.

A more detailed description of the invention follows, taken with the accompanying drawings, in which.

Figure 1:
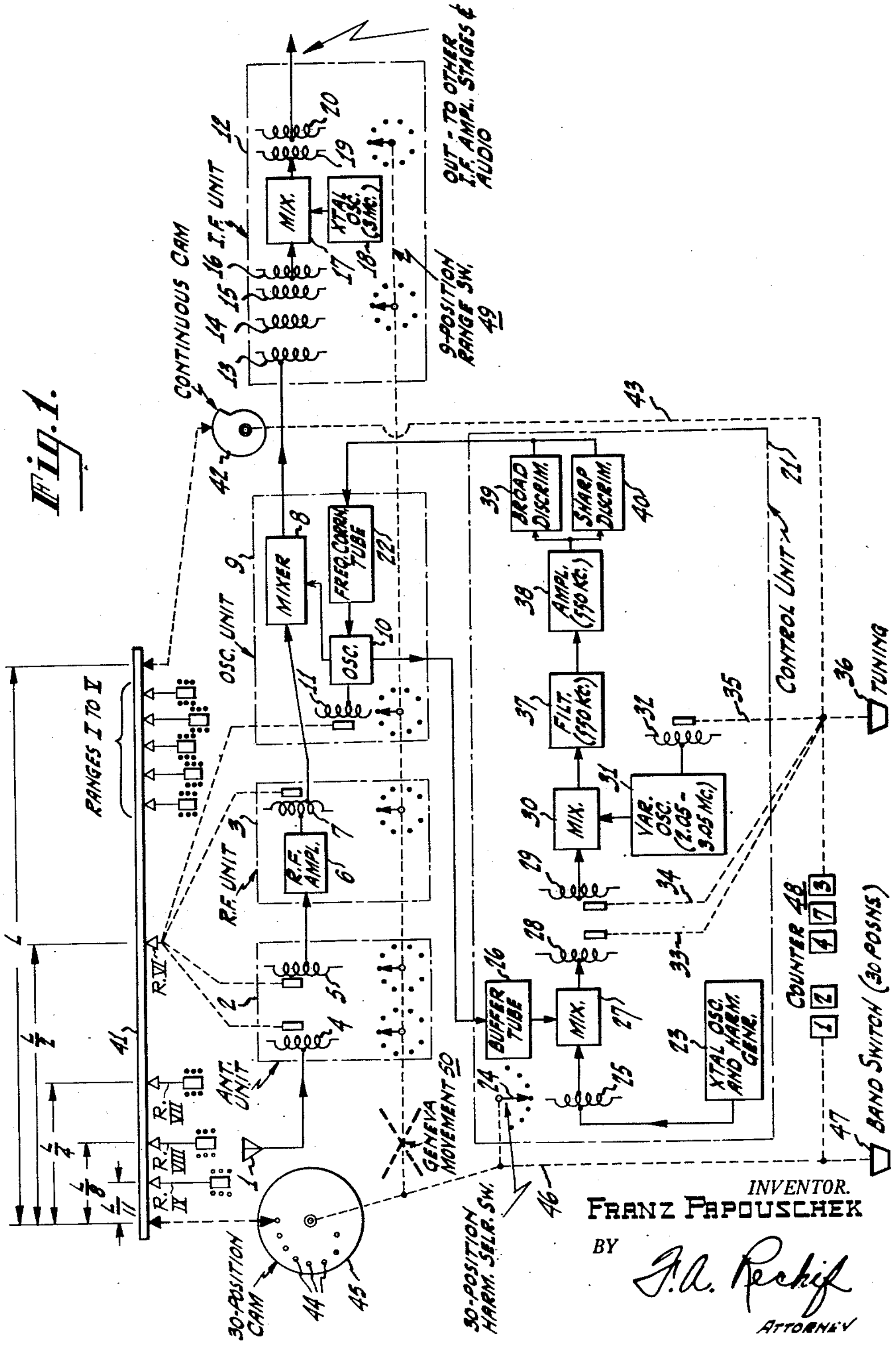
Fig. 1 is a schematic and block diagram of a portion of a radio receiver utilizing the invention.

Referring first to Fig. 1, there is shown a combined block and schematic diagram of a portion of a communications receiver (the intermediate frequency and audio stages not being completely shown). Signals in the R. F. range (for example, anywhere in the range of 70 kc. to 28 mc.) are picked up by a receiving antenna 1 and fed through a tunable antenna unit 2 to an R. F. unit 3 including a tunable R. F. amplifier 6. As will be set forth in detail hereinafter, the entire frequency range of the receiver of the invention (from 70 kc. to 28 mc.) is divided into thirty bands, grouped into nine ranges. The antenna unit 2 comprises a pair of coupled permeability-tuned coils for each of the nine receiver ranges, each pair of coils being selectively switched into the circuit as required, one pair at a time, in a manner to be described. For simplicity, only one of these nine pairs of coils is illustrated in Fig. 1, this pair being the coils 4 and 5 for range VI. Each of the eighteen coils (such as coils 4 and 5) in antenna unit 2 has an associated trimmer capacitor (not shown), to establish the appropriate frequency range for the coil.

The R. F. unit 3 comprises an R. F. amplifier 6 with a single permeability-tuned coil for each of the nine receiver ranges, one coil at a time being selectively switched into the anode circuit of the R. F. amplifier as required, in a manner to be described. Only one of these coils is illustrated in Fig. 1, this being the coil 7 for range VI.

The output of R. F. unit 3 is fed into a mixer 8 located in an oscillator unit 9. Also located in unit 9 is a master (captive) oscillator 10 which serves as the first heterodyne oscillator of the receiver and the main portion of the output of which is fed into mixer 8 for heterodyning purposes. The oscillator tube operates in conjunction with a series of permeability-tuned coils and their accompanying trimmers (the latter not shown), there being a single such coil for each of the nine receiver ranges, one coil at a time being selectively switched into circuit with the oscillator tube as required, in a manner to be described. Only one of these coils is illustrated in Fig. 1, this being the coil 11 for range VI.

In mixer 8, heterodyning energy from oscillator 10 beats with signal energy from R. F. unit 3 to produce the first intermediate frequency (I. F.), which is passed on to an I. F. unit 12.

The following table shows the distribution of ranges and frequency bands for a typical communications receiver utilizing this invention.

*Distribution of ranges and bands*

| Range | Band | RF | 1st I. F. | M. O. 10 | Harmonic Freq. Selected (mc.) |
|---|---|---|---|---|---|
| I | 1 | 70–200 kc | 500 kc | 570–700 kc | |
| II | 2 | 200–450 kc | 150 kc | 350–600 kc | ---------- |
| III | 3 | 450–1,000 kc | 150 kc | 600–1,150 kc | ---------- |
| IV | 4 | 1–2 mc | 3.5 mc | 4.5–5.5 mc | 3 |
| V | 5 | 2–3 mc | 3.5 mc | 5.5–6.5 mc | 4 |
| VI | 6 | 3–4 mc | 2.5 mc | 5.5–6.5 mc | 4 |
| | 7 | 4–5 mc | 2.5 mc | 6.5–7.5 mc | 5 |
| VII | 8 | 5–6 mc | 3.5 mc | 8.5–9.5 mc | 7 |
| | 9 | 6–7 mc | 3.5 mc | 9.5–10.5 mc | 8 |
| | 10 | 7–8 mc | 3.5 mc | 10.5–11.5 mc | 9 |
| | 11 | 8–9 mc | 3.5 mc | 11.5–12.5 mc | 10 |
| VIII | 12 | 9–10 mc | 3.5 mc | 12.5–13.5 mc | 11 |
| | 13 | 10–11 mc | 3.5 mc | 13.5–14.5 mc | 12 |
| | 14 | 11–12 mc | 3.5 mc | 14.5–15.5 mc | 13 |
| | 15 | 12–13 mc | 3.5 mc | 15.5–16.5 mc | 14 |
| | 16 | 13–14 mc | 3.5 mc | 16.5–17.5 mc | 15 |
| | 17 | 14–15 mc | 3.5 mc | 17.5–18.5 mc | 16 |
| | 18 | 15–16 mc | 3.5 mc | 18.5–19.5 mc | 17 |
| | 19 | 16–17 mc | 3.5 mc | 19.5–20.5 mc | 18 |
| IX | 20 | 17–18 mc | 3.5 mc | 13.5–14.5 mc | 12 |
| | 21 | 18–19 mc | 3.5 mc | 14.5–15.5 mc | 13 |
| | 22 | 19–20 mc | 3.5 mc | 15.5–16.5 mc | 14 |
| | 23 | 20–21 mc | 3.5 mc | 16.5–17.5 mc | 15 |
| | 24 | 21–22 mc | 3.5 mc | 17.5–18.5 mc | 16 |
| | 25 | 22–23 mc | 3.5 mc | 18.5–19.5 mc | 17 |
| | 26 | 23–24 mc | 3.5 mc | 19.5–20.5 mc | 18 |
| | 27 | 24–25 mc | 3.5 mc | 20.5–21.5 mc | 19 |
| | 28 | 25–26 mc | 3.5 mc | 21.5–22.5 mc | 20 |
| | 29 | 26–27 mc | 3.5 mc | 22.5–23.5 mc | 21 |
| | 30 | 27–28 mc | 3.5 mc | 23.5–24.5 mc | 22 |

It will be noted from the above table that the first I. F. is 3.5 mc. for all high-frequency ranges (ranges IV through IX), with the exception of range VI, where it has been changed to 2.5 mc., in order to enable the receiver to tune through a 3.5-mc. R. F. signal frequency. This 3.5-mc. stage consists of four tuned circuits, represented in Fig. 1 by coils 13, 14, 15 and 16 respectively. The 2.5-mc. frequency is obtained by switching additional capacitance across each of these four tuned circuits, this switching being accomplished along with the coil switching in units 2, 3 and 9 in a manner to be described. On the lower three ranges (I, II, and III) this first I. F. stage is bypassed completely, the switching necessary for this also being accomplished along with the coil switching in units 2, 3 and 9.

The first I. F. is heterodyned down to 500 kc. by means of a second mixer 17 in unit 12, the 3-mc. heterodyning frequency for this mixer being obtained from a crystal oscillator 18, also in unit 12. The 500-kc. second I. F. stage consists of a double-tuned circuit (represented by coils 19 and 20) which is coupled into a third mixer (not shown). In this third mixer, the signal is heterodyned with a 650-kc. signal obtained from a crystal oscillator, to produce a 150-kc. third I. F. It will be noted that for range III the first I. F. is 150-kc. in order to enable the receiver to tune through a 500-kc. R. F. signal frequency. For range II, the first I. F. is also 150 kc. For ranges II and III, the first and second I. F. stages are both bypassed, the switching necessary for this also being accomplished along with the coil switching in units 2, 3 and 9, in a manner to be described. The output of the 150-kc. third I. F. is fed to a detector, thence to audio stages.

The 150-kc. third I. F. stages may be provided with a variable selectivity control arrangement, providing a variable bandwidth from 300 cycles to over 10,000 cycles. Such an arrangement may for example be of the type illustrated in my copending but now abandoned application, Serial No. 365,505, filed July 1, 1953.

The control unit 21 comprises the components for maintaining the desired frequency accuracy of the master captive oscillator 10. In other words, unit 21 comprises the frequency control system for controlling the frequency of oscillator 10, with the exception of the frequency correction tube (reactance tube) 22, which is located in oscillator unit 9. Tube 22 acts as a variable reactance across the tuned circuit of oscillator 10 to maintain the oscillator frequency at the exact desired value. This control is provided by means of a variable D. C. voltage which appears on the grid of tube 22; this D. C. voltage is provided by the control unit 21, now to be described.

A 1-mc. crystal oscillator and harmonic generator 23 in unit 21 produces 1-mc. harmonic one of which is selected (in accordance with the above table) by a thirty-position harmonic selector switch 24 schematically illustrated as operating on an output coil 25. The number of positions of switch 24 corresponds to the total number of bands in the above table. The harmonic generator in 23 may for example be of the type illustrated in my copending application, Serial No. 423,725, filed April 16, 1954, now Patent No. 2,742,572, dated April 17, 1956, while the harmonic selector switch 24 may for example be of the type illustrated in my copending application, Serial No. 456,936, filed September 20, 1954. A sample of the master oscillator voltage is fed into a buffer tube 26 and the output of this buffer is mixed with the desired, selected harmonic in mixer 27. The harmonic is selected so that the output of mixer 27 varies from 1.5 to 2.5 mc. as the master oscillator frequency changes across each band, for each of bands 4 through 30, ranges IV through IX. The master oscillator frequency is not controlled by unit 21 for the three lowest ranges and bands, since frequency error is not significant at these low frequencies. This 1.5 to 2.5 mc. frequency is selected by means of a double-tuned variable frequency bandpass filter including two permeability-tuned coils 28 and 29 and their accompanying tuning capacitances (not shown). The output of filter 28, 29 is coupled to a mixer 30.

A continuously-variable oscillator 31 is included in control unit 21. This oscillator is a linear permeability-tuned oscillator with a tuned coil 32, having a range of 2.05 to 3.05 mc. The output of oscillator 31 is coupled to mixer 30 through an isolation tube (not shown). Both the bandpass filter 28, 29 and the oscillator 31 are tuned across each band by driving means (indicated by dotted lines 33, 34 and 35) coupled to the tuning knob 36. Since both the 1.5 to 2.5 mc. signal from the bandpass filter 28, 29 and the 2.05 to 3.05 mc. signal from variable oscillator 31 are varying simultaneously, the beat frequency output of mixer 30 is constant at 550 kc. This frequency is selected in a double-tuned bandpass filter 37 coupled to the anode circuit of mixer 30 and is coupled to a 550-kc. amplifier 38 which amplifies this signal and drives two discriminator systems 39 and 40 both connected to the output of amplifier 38. Discriminator 39 is a broad discriminator with approximately 50 kc. peak separation, while discriminator 40 is a sharp discriminator with approximately 5 kc. peak separation. The outputs of discriminators 39 and 40 are algebraically added and the resultant applied to frequency correction tube 22 for control of the frequency of the master captive oscillator 10. The algebraic sum of the discriminator outputs is a D. C. voltage.

The captive oscillator system described, including the arrangement in control unit 21, is illustrated in my copending but now abandoned application, Serial No. 381,315, filed September 21, 1953.

Referring again to the above table, it may be seen that the receiver has thirty bands extending from 70 kc. to 28 mc., grouped into nine ranges I through IX. For tuning, nine sets of coils are provided, one for each of the nine ranges. Each set comprises four coils, constituted by two coils in the antenna unit 2, one coil in the R. F. unit 3, and one coil in the oscillator unit 9. In Fig. 1, the complete set of four coils is illustrated for only one of the ranges, range VI, while each of the other ranges is represented by only one coil. Each of the total of thirty-six coils is permeability tuned, with the core being arranged for movement with respect to its associated coil. It may be noted that each band has a coverage of 1 mc., except the lowest three bands, which cover the range from 70 kc. to 1000 kc. (1 mc.).

All the cores which tune the various coils are mounted on a rocker plate assembly 41 (shown for convenience in Fig. 1 as an elongated member or elongated lever), which is so mounted as to be capable of independent vertical motion on two parallel sides, as will be explained hereinafter in the mechanical description. The right-hand side of assembly 41 is driven by means of continuous linear cams, such as cam 42, to provide a total vertical motion of one inch. Such cams are coupled to the tuning knob 36 (as indicated by the dotted line 43) through suitable gearing in such a manner that ten complete revolutions of this knob cause one inch of vertical travel of the right-hand side of rocker 41. The height of the left-hand side of rocker plate 41 is controlled by a series of pins (thirty in number, equal to the number of bands) such as 44 projecting from a main cam member 45 connected (as indicated by the dotted line 46) to, and driven by, the band switch knob 47. The pins 44 are located at various radial distances from the axis of member 45, or from the shaft driving this member, to provide a caming effect, thereby to raise the left-hand side of rocker 41 different distances. The left-hand side of the rocker plate is also capable of a maximum vertical excursion of one inch.

All of the thirty-six cores (for ranges I through IX) are mounted on rocker plate 41 so as to be moved vertically thereby, this being indicated by the outline arrowheads connecting each of the cores illustrated to rocker 41. Each core is mounted inside of the coil with which it is associated, as illustrated in various locations in Fig. 1, and as each core moves up and down with respect to its coil (which remains fixed in position) due to the movement of rocker plate 41, the tuning of the various coils is varied. These coils are all permeability-tuned.

The height of any one particular core is dictated by three factors: the height of the left-hand side of the plate 41, the height of the right-hand side of the plate, and the relative mounting point of the core on the plate. For ranges I to V, in which each coil is used for only one band, the left-hand side of the plate 41 is set at the midposition of its available travel by five respective pins 44, and the right-hand side moves through the total excursion of one inch as each band is tuned from one extreme to the other by tuning knob 36. This motion transmits a linear motion to the cores on the plate 41, which in turn changes the frequency of each corresponding coil. All of these coils (for ranges I through V) are designed in such a manner that linear core travel produces linear frequency change. These five sets (of four each) of cores are located toward the right-hand side of plate 41 as illustrated, in order to receive sufficient linear motion to cover the desired frequency ranges. In general, the cores for each range are attached to the rocker 41 at a point spaced a distance $L/n$ from the left-hand side thereof, where L is the total length of the rocker (between its two driving points) and $n$ is the number of bands to be covered on the particular range. Range VI cores are thus located exactly midway between the left-hand and right-hand drive points on plate 41, since this range covers two bands; range VII cores are located a distance of $L/4$ from the left-hand side of the plate since this range has four bands; range VIII cores are located a distance of $L/8$ from the left-hand side of the plate since this range has eight bands; finally, range IX cores are located a distance of $L/11$ from the left-hand side of the plate since this range has eleven bands.

Range VI coils cover a 2-mc. range in two bands. For the 3–4 mc. band (band 6), the left-hand side of the plate 41 is left at its extreme bottom position and the right-hand side of the plate starts at the bottom position for the 3-mc. end of the band. As tuning proceeds from 3 mc. toward the 4-mc. end, the right-hand side of the plate is raised through its one inch of travel. This one inch at the edge of the plate represents one-half inch of travel midway across the plate, where this set of cores (range VI cores) is located. Hence, at 4 mc. these cores have been lifted one-half inch in their respective coils 4, 5, 7 and 11. In tuning over the 4–5 mc. band (band 7), the operation of switching bands, by means of band switch knob 47, raises the left-hand side of the plate to its extreme top position so that when the fine tuning has been returned to the low end of its travel, the plate is fully raised at the left-hand side and at the bottom of its travel on the right-hand side. This one inch raise on the left-hand side transmits one-half inch of travel to the midpoint of the plate, with the result that the cores are again at the same position at the beginning of the 4–5 band as they were at the end of the 3–4 mc. band. The tuning operation from 4 to 5 mc. again raises the right-hand side of the plate through 1" of travel. This transmits an additional one-half inch of travel to the midpoint of the plate, bringing the cores associated with coils 4, 5, 7 and 11 out (lifting them) the remaining one-half inch of their one-inch total travel.

In a similar manner, range VII coils are designed to cover four one-mc. bands, consequently these cores are located one-quarter of the way ($L/4$) across the rocker plate, and the left-hand side is raised in four fixed steps.

Similar considerations apply to range VIII, which covers eight one-mc. bands, and to range IX, which covers eleven one-mc. bands.

The frequency indication on all bands above 1 mc. (for ranges IV through IX) is given by a mechanical counter 48 having two sections separately driven. The two left-hand figures, which represent the megacycle reading, are driven from the shaft 46 coupled to band switch knob 47, and the three right-hand figures, representing kilocycles, are driven from the tuning control 36. A slight amount of over-travel beyond the 000 and 999 readings is provided, but an additional plus or minus sign appears on the counter to avoid any ambiguity as to the actual frequency of the receiver.

The thirty-position harmonic selector switch 24 is mechanically coupled to the thirty-position band switch knob 47 and operates to select the desired harmonic for each of the thirty bands, as given in the above table.

A nine-position range switch, indicated generally by the numeral 49, has a plurality of switching wafers and is coupled to be intermittently actuated from the main band switch cam 45 through a Geneva movement indicated schematically at 50. Range switch 49 has one position for each of the ranges I through IX, and this switch is so operated from the band switching arrangement, and the wafers thereof are so positioned and connected, as to select a different pair of coils in antenna unit 2 for each range, a different coil in R. F. unit 3 for each range, and a different coil in oscillator unit 9 for each range; switching wafers are also provided on switch 49 to switch the connections and/or to switch capacitors in I. F. unit 12, in accordance with the data given in the above table.

The continuously variable oscillator 31 is connected directly to the shaft of the tuning knob 36, and the movable cores of band pass filter 28, 29 are tuned across each band by a drive which is connected to the rear of the oscillator 31. The frequency range of oscillator 31 is tuned over by ten revolutions of the tuning knob 36 which, as previously stated, also operates (through gearing) the cams 42 on the right-hand side of rocker plate 41. The tuning accuracy of oscillator 31 is such that the three-figure part of the counter 48 which is driven from the tuning control 36 actually reads significant kilocycles.

The operation of the control unit 21 can best be explained with a typical example. It will be assumed that it is desired to tune the receiver to 14.2 mc. The band switch 47 will be turned until the figure "14" appears in the two left-hand positions of counter 48, after which the trip button will be pressed to drop the rocker plate 41 into place on the desired one of pins 44. This moves the cores for range VIII into their proper positions for band 17, by means of rocker plate 41. The construction and operation of this trip button mechanism will be explained in detail hereinafter.

From the table, it may be seen that this position of the band switch 47 will have selected (by means of range switch 49, actuated from band switch shaft 46) the coils (in units 2, 3 and 9) for range VIII, and will have switched the harmonic selector switch 24 to select the sixteenth harmonic (frequency of 16 mc.) of the crystal oscillator in 23. The master oscillator frequency is adjusted by turning the fine tuning knob 36 until the figure "200" appears in the three right-hand positions of counter 48. This moves the cores for range VIII, by means of rocker plate 41, into their proper positions for 14.2 mc. From the table, it may be seen that the nominal master oscillator frequency range for this band (band 17) is 17.5 to 18.5 mc., and hence should be 17.7 mc. for this particular frequency setting. This frequency is coupled through buffer 26 and mixed with the selected sixteenth harmonic to give a 1.7-mc. wave output from mixer 27. The output of the variable oscillator 31 will have been tuned to 2.25 mc. by knob 36; consequently the output of mixer 30 is at 550 kc. Since this is the nominal center frequency of the two discriminators 39 and 40, there will be no D. C. output voltage therefrom and hence no correction applied to the master oscillator 10. If, however, it is assumed that the master oscillator has an initial error of 10 kc., this would pass through the control system and appear as a 560-kc. output at discriminators 39 and 40. This deviation from the discriminator center frequency results in a large D. C. voltage being developed, which appears at the frequency correction tube 22 in such a manner as to control the frequency of the master oscillator to reduce this nominal 10-kc. error by a factor of approximately 1500, to approximately seven cycles. In a similar manner, any mistracking of the master oscillator is automatically reduced by the factor of 1500. The broad discriminator 39 provides the necessary D. C. voltage to correct the oscillator frequency to a point at which the sharp discriminator 40 can control it, thus permitting reasonably large tracking errors to be brought under control. This control system operates in a similar manner on all bands above one mc., no control being provided on the lowest three bands, the frequency error being not significant at these low frequencies.

Figure 2:
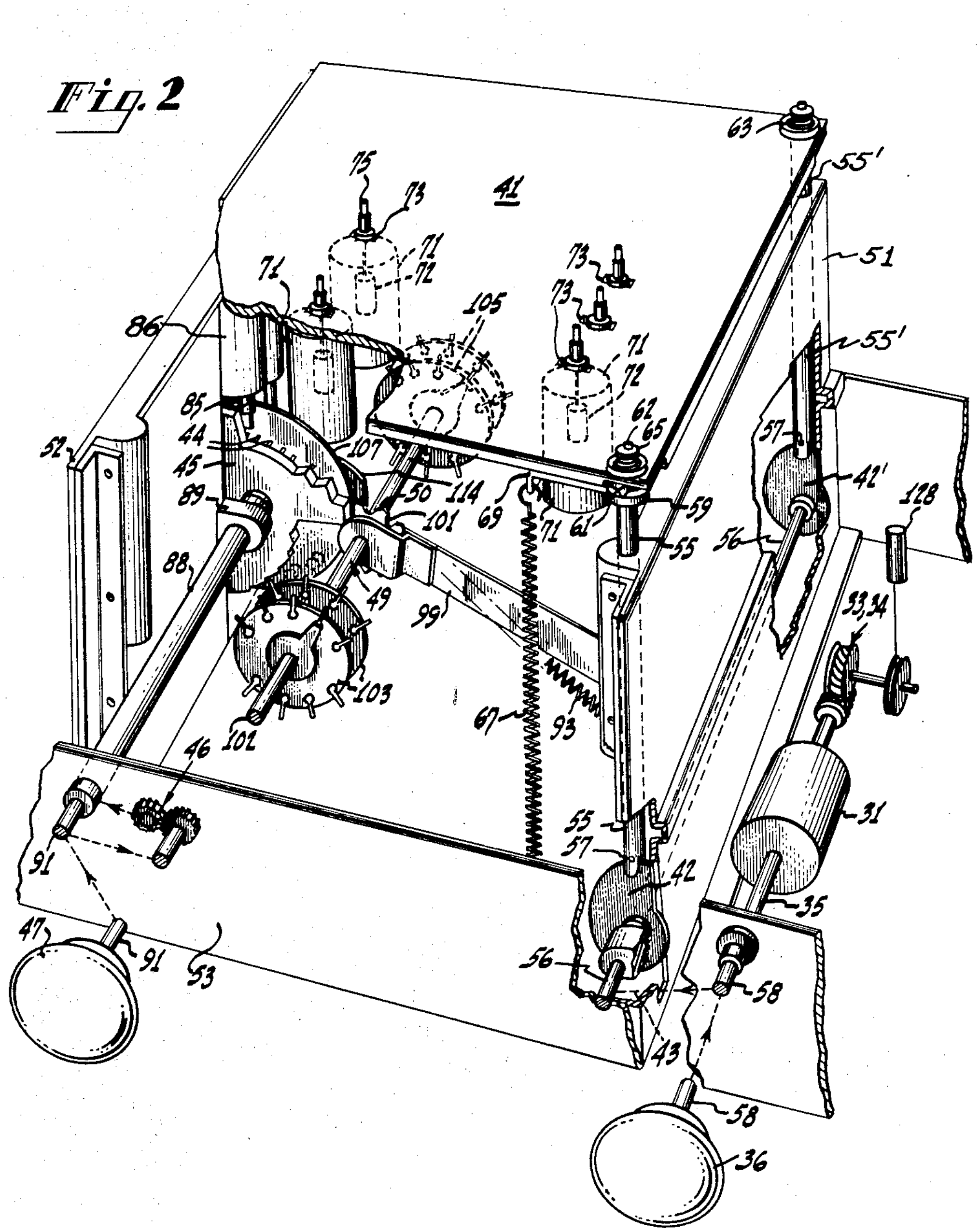
Fig. 2 is a perspective view, partly diagrammatic and partly broken away, of the principal mechanical parts of a receiver utilizing the invention.

A detailed description of the mechanical arrangement for performing the various tuning and switching functions will now be given. Referring first to Fig. 2, which is a perspective view, partly diagrammatic, of the principal mechanical parts of the receiver, with parts broken away to show certain details, the rocker plate 41 is generally rectangular in outline and is mounted atop a framework having side walls 51 and 52 and front and back bracing members 53 and 54. The walls 51 and 52 and members 53 and 54 are rigidly fastened together at their respective ends to form a framework in the form of an open rectangle. Plate 41 is so mounted on the framework as to be capable of vertical motion with respect thereto, at each of the two sides of the plate, the motion at these two sides being independent. The right-hand side of plate 41 is moved up and down by means of front and rear push rods 55 and 55′ respectively which at their upper ends engage the right-hand front and rear corners of the plate, respectively, in a manner to be described hereinafter and which are mounted for vertical sliding movement in bearings provided near the two respective ends of right side wall 51 of the framework. A pivotal connection (not shown in Fig. 2, but later to be described in detail) is provided between the left-hand side of plate 41 and the left side wall 52 of the framework, to allow vertical motion of the right-hand side of plate 41 without corresponding vertical motion of the left-hand side thereof, that is, a tilting or rocking motion of the rocker plate. Likewise, the coupling between rods 55 and 55′ and the right-hand side of the plate 41 is so arranged as to allow pivotal motion of the plate with respect to the rods, so that vertical motion of the left-hand side of the rocker plate may be effected without corresponding vertical motion of the right-hand side thereof, that is, again a tilting or rocking motion of the rocker plate.

A shaft 56 is journaled for rotation at its ends in the front and back members 53 and 54. A front continuous cam 42 and a rear continuous cam 42′ are rigidly fastened to shaft 56, near the respective ends thereof, cam 42 being vertically aligned with rod 55 and cam 42′ being vertically aligned with rod 55′. The lower end of rod 55 rides on the cam surface of cam 42, and the lower end of rod 55′ rides on the cam surface of cam 42′. Since the couplings of both rods 55 and 55′ to the respective cams 42 and 42′ are exactly the same, only one of these (55′) will be described in detail, in connection with Fig. 3. The lower end of rod 55′ is centrally (front-to-rear) slotted and a roller 57 of small diameter extends through the slot and is journaled in the two opposite walls bounding the slot. The edge of cam 42′ extends into the slot and roller 57 engages and rides on the edge (cam surface) of cam 42′, as a cam follower. Since the lower end of rod 55 rides on cam 42 and the lower end of rod 55′ rides on cam 42′, rotation of cams 42 and 42′ by shaft 56 causes rods 55 and 55′, and thus the right-hand side of plate 41, to move vertically. Clockwise rotation of shaft 56 causes rods 55 and 55′ and the right-hand side of plate 41 to move downwardly, while counter-clockwise rotation of said shaft causes rods 55 and 55′ and the right-hand side of plate 41 to move upwardly. In Fig. 2, the right-hand side of plate 41 is illustrated at the upper limit of its travel.

The tuning knob 36 is secured to a tuning shaft 58 which drives camshaft 56 through a mechanical connection indicated schematically at 43. This mechanical connection 43 includes a gear train (to be described in more detail hereinafter) having a ratio of 11:1, eleven revolutions of knob 36 and shaft 58 causing one revolution of shaft 56. Thus, ten revolutions of knob 36 cause shaft 56 and cams 42 and 42′ to move angularly through $^{10}/_{11}$ of 360°. The cams 42 and 42′ are designed to provide a total vertical travel of the right-hand side of plate 41 of one inch, in $^{10}/_{11}$ of 360° of angular rotation of the cams. Thus, ten revolutions of tuning knob 36 cause one inch of vertical travel of the right-hand side of rocker 41.

Figures 3, 4, 5:
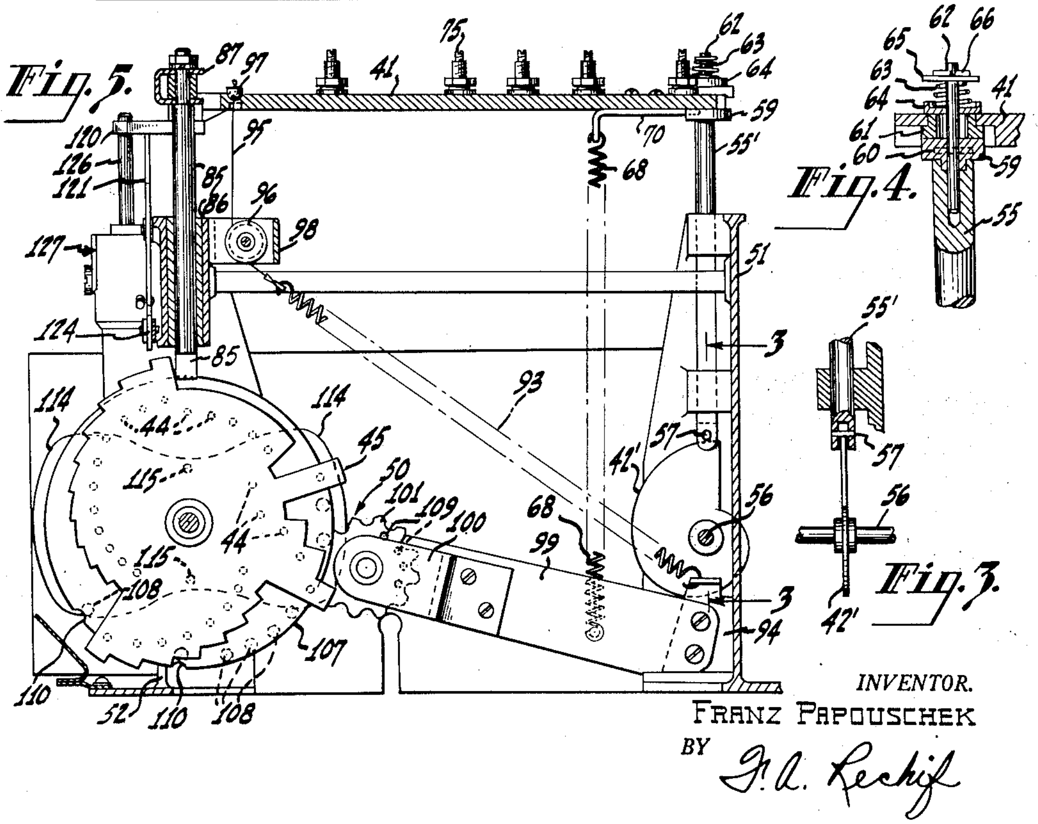
Figs. 3 and 4 are enlarged sectional views of certain details of construction.
Fig. 5 is a sectional view taken along line 5—5 of Fig. 7, looking in the direction of the arrows.

The couplings between push rods 55 and 55′ and the right-hand side of plate 41 will now be described in detail, with reference to Fig. 4. Since both of these are exactly the same, only one will be described, that of rod 55. A disc 59 having a radially extending slot 60 therein, is fastened securely on the upper end of rod 55, to provide an enlarged flat bearing surface at the upper end of this rod. A bushing 61 provided with two diametrically opposite V-shaped knife edges, is fastened securely to plate 41 and extends through an aperture provided therein, and these knife edges are adapted to engage and pivot on the upper flat surface of disc 59. A pin 62, of smaller diameter than rod 55, is fastened securely to the upper end of this rod, concentrically of the rod, and extends through the aperture in plate 41 previously referred to. A compression spring 63 surrounds pin 62, the lower end of this spring bearing against a washer 64 which in turn bears against the top surface of rocker plate 41, and the upper end of this spring bearing against a flat washer 65 which is restrained from moving vertically upward on pin 62 by means of a C-washer 66 which firmly engages pin 62.

The knife edges of the front and rear bushings 61, bearing against the flat top surface of the respective discs 59, provide a pivotal mounting of plate 41 on rods 55 and 55', bushings 61 being secured to the plate and discs 59 being secured to the respective rods 55 and 55'. This enables vertical motion of the left-hand side of the rocker plate 41 to be effected without corresponding vertical motion of the right-hand side thereof. At the same time, vertical motion of the right-hand side of plate 41 may be effected through rods 55 and 55' and their respective discs 59, to the respective bushings 61 which are secured to plate 41.

Plate 41 is held down on rods 55 and 55', and the rollers 57 of these rods are held down on the respective cams 42 and 42', with sufficient force to follow these cams, by means of a front tension spring 67 and a rear tension spring 68, the lower end of front spring 67 being attached to the lower portion of front brace 53 and the lower end of rear spring 68 being attached to the lower portion of rear brace 54. The upper end of front spring 67 is attached to a bracket 69 bolted to the right front edge of plate 41, while the upper end of rear spring 68 is attached to a bracket 70 bolted to the right rear edge of plate 41. Each of these brackets 69 and 70 has a projecting ear portion which fits into the slot 60 in the respective disc 59, thus preventing any rotation or mispositioning of the rods 55 and 55' relative to the respective cams 42 and 42'.

The side walls 51 and 52 are provided with internally extending ledges or supports (not shown) on which are mounted three subassemblies (more particularly illustrated in Fig. 11) constituting respectively antenna unit 2, R. F. unit 3 and oscillator unit 9, these units being arranged in that order from front to rear of the framework. These subassemblies are mounted below rocker plate 41 and include upstanding coils which are each arranged to be permeability tuned by the movement of a powdered iron core in the respective coil, the cores being fastened to rocker plate 41 and moving therewith while the coil remain fixed in position. There are a total of thirty-six cores (four cores for each of the nine ranges in the above table) which hang down from the rocker plate 41 and extend into the centers of the respective coils. Subassembly 2 has a total of eighteen upstanding coils into which extend, respectively, eighteen cores fastened to and hanging down from plate 41, two coil-and-core combinations for each of the nine receiver ranges. Subassembly 3 has a total of nine coils into which extend, respectively, nine cores fastened to and hanging down from plate 41, one coil-and-core combination for each of the nine receiver ranges. Subassembly 9 has a total of nine coils into which extend, respectively, nine cores fastened to and hanging down from plate 41, one coil-and-core combination for each of the nine receiver ranges. In Fig. 2, there are shown by way of illustration several coils 71 and several cores 72, the latter being fastened to and hanging down from plate 41.

Figure 8:
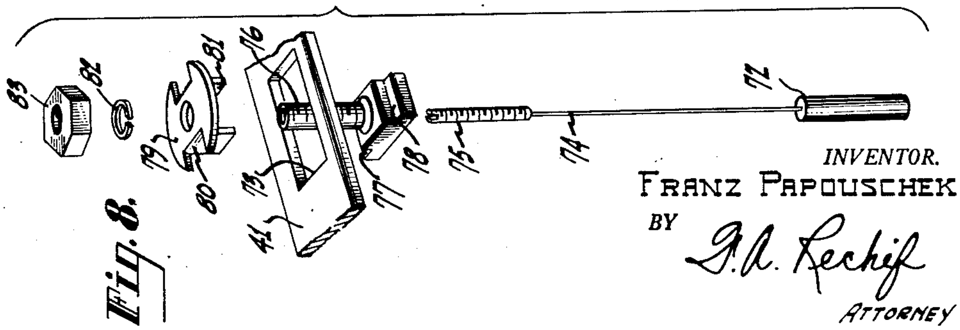
Fig. 8 is an exploded view of the assembly for mounting the tuning cores on the rocker plate.

The mode of attachment of each of the thirty-six cores to the rocker plate 41 will now be explained, referring to the exploded view, Fig. 8. There are thirty-six rectangular slots such as 73 in plate 41, one for each of the thirty-six cores or slugs, each slot having its longer dimension extending from left to right in Fig. 2, that is, in a direction such that each core 72 can be moved along its respective slot 73 toward or away from the right-hand side (tuning side) of the rocker plate 41. Each core 72 is mounted on one end of a stiff bronze wire 74, and at the other end of wire 74 there is fastened securely a threaded bolt 75, which allows for an initial alignment of the core and coil combinations. The threads on bolt 75 engage those in a tapped hole extending longitudinally entirely through a bolt 76 which has external threads and also an integral enlarged head portion provided with two opposite shoulders 77 and 78. The dimension of the head portion between the inside edges of shoulders 77 and 78 is made just equal to the shorter dimension of slot 73, so that the upper (in Fig. 8) part of the head portion can fit inside slot 73 when the device is in assembled condition, thus keeping bolt 76, bolt 75 and core 72 from rotating, and the shoulders 77 and 78 themselves can engage the lower surface of plate 41 immediately adjacent the slot 73. The dimension of the head portion of bolt 76 between the outside edges of shoulders 77 and 78 (the maximum dimension of this head portion) is less than the longer dimension of slot 73, so that to assemble the device the bolt 76, with the bolt 75 (and its appendages 74 and 72) mounted therein may be dropped through slot 73 from the upper surface of plate 41, following which the bolt 76 may be rotated a quarter-turn to locking position in slot 73. A washer 79, provided with a central aperture for passing over bolt 76, is adapted to engage the upper surface of plate 41 adjacent slot 73. This washer is provided with two diametrically opposite downwardly extending tabs 80 and 81 the width of each of which is equal to the shorter dimension of slot 73 and the length of each of which may be approximately equal to the thickness of plate 41. The distance between tabs 80 and 81 (measured parallel to the longer dimension of slot 73 when the device is in assembled relation) is slightly greater than that dimension of the head portion of bolt 76 which is parallel to the longer dimension of slot 73 when the device is assembled, so that upon assembly washer 79 can be slipped down over bolt 76 with tabs 80 and 81 extending through slot 73, engaging the sides thereof and lying adjacent the sides of the head portion of bolt 76, thus helping to keep bolt 76 from rotating when the device is tightened into position. To tighten and lock the assembly in position, a lock washer 82 slips over bolt 76 and engages the upper surface of washer 79, and a threaded nut 83 is mounted atop this lock washer and threads onto the external threads of bolt 76. Although not shown in the drawings, a slot is cut through one side of bolt 76 near the top end thereof, so that the threads of bolt 75 will be exposed when the device is in assembled relation. A substantially U-shaped spring clip member (not shown) made of rather stiff wire is mounted with one of its arms engaging the threads of bolt 75 (by means of this slot) and its other arm engaging the external threads of bolt 76, to provide a binding force on the threads of bolt 75 so as to help keep this latter bolt in its adjusted position.

The upper end of bolt 75 is provided with a screwdriver slot, so as to enable this bolt to be turned in its threads (the internal threads of bolt 76) to move core 72 up and down relative to its coil, for an initial alignment. Also, the slot 73 in plate 41 allows an adjustment to be made in the core travel. For example, if the permeability of a core 72 is smaller than a certain standard value, the nut 83 may be loosened and the entire assembly (including the bolt 76 which carries bolt 75 and core 72) may be moved longitudinally of slot 73 toward the right-hand or tuning side of the rocker plate 41, where the vertical movement (during tuning) of the rocker plate will be greater, after which nut 83 may be tightened to lock the assembly in its adjusted position. Movement in the reverse direction in slot 73 may be effected if the core permeability is larger than the standard value. Each of the thirty-six cores 72 may in this way be moved along its respective slot 73 toward or away from the right-hand side of the rocker plate 41, for purposes of adjustment, and each of the thirty-six cores may be initially aligned by means of its respective bolt 75. For convenience in initially positioning each Fig. 8 assembly in the center of the length of its respective slot 73, index marks (not shown) may be provided on each washer 79 and on the upper surface of plate 41 adjacent each slot 73, the marks on each washer 79 being located on the center line of the aperture in the washer and the marks on plate 41 being located at the center of the long dimension of each respective slot 73. Bringing of the index marks on washer 79 into alignment with the index marks on plate 41 will then assure that the respective core assemblies are centered in the slots 73.

Each of the thirty-six cores hanging down from rocker plate 41, and secured thereto (so as to move with the rocker plate) in the manner just described in connection with Fig. 8, fits down into the center of a respective coil. The thirty-six coils, as previously stated, are mounted on subassemblies 2, 3 and 9 inside of the framework, these subassemblies being stationary, while the cores move with plate 41 as the latter is moved with respect to the framework. The structure for vertically moving the right-hand side of plate 41 has been described previously, and that for vertically moving the left-hand side of this plate will be described hereinafter. The cores 72, moving with plate 41, effect permeability tuning (by varying the inductance of the coils) of the stationary coils such as 71.

Figure 9:
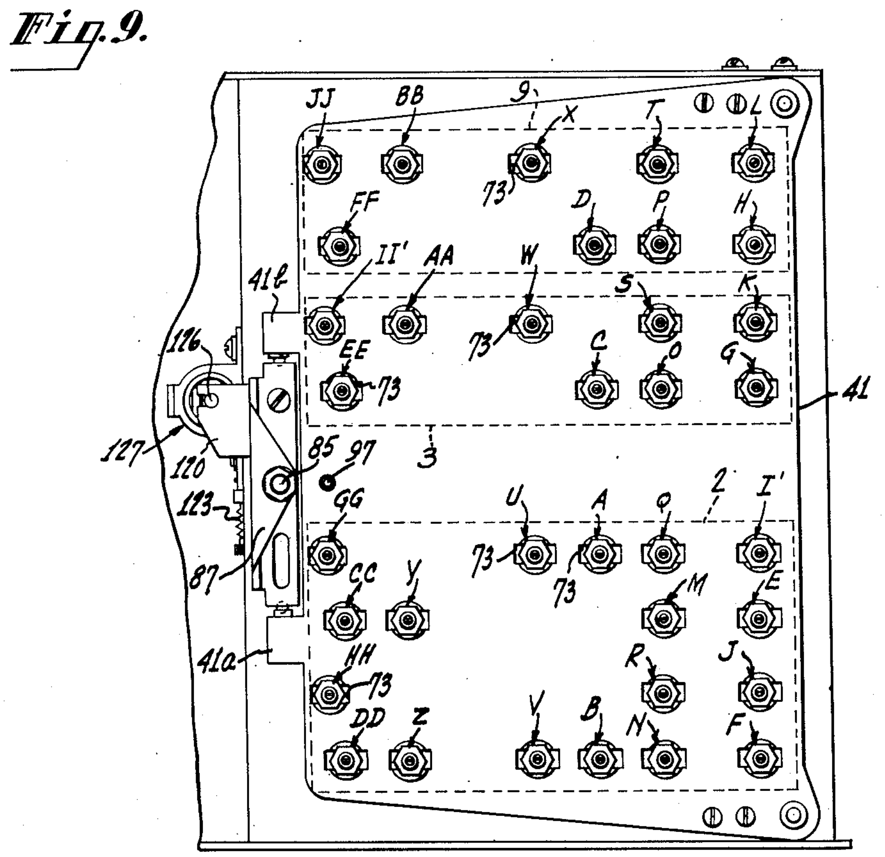
Fig. 9 is a top view of the rocker plate and its mounting.

The relative positions of the thirty-six cores on plate 41, four cores for each of the nine ranges (I through IX in the above tabe), are illustrated in Fig. 9, as well as the relative positions of the subassemblies 2, 3 and 9 (on which the coils are mounted). The subassemblies are indicated in Fig. 9 by the dotted-line rectangles 2, 3 and 9, which are the antenna unit, the R. F. unit, and the oscillator unit, respectively. In Fig. 9, which is a top view of the rocker plate 41 with all the core assemblies (as in Fig. 8) mounted thereon, the various core assemblies are denoted by letter designations, with reference to the above table. Each range utilizes two core assemblies for antenna 2, one core assembly for R. F. unit 3, and one core assembly for unit 9. Range I utilizes core assemblies A and B for unit 2, core assembly C for unit 3, and core assembly D for unit 9. Range II utilizes core assemblies E and F for unit 2, core assembly G for unit 3, and core assembly H for unit 9. Range III utilizes core assemblies I' and J for unit 2, K for unit 3, and L for unit 9. Range IV utilizes core assemblies M and N for unit 2, O for unit 3, and P for unit 9. Range V utilizes core assemblies Q and R for unit 2, S for unit 3, and T for unit 9. Range VI utilizes core assemblies U and V for unit 2, W for unit 3, and X for unit 9. Range VII utilizes core assemblies Y and Z for unit 2, AA for unit 3, and BB for unit 9. Range VIII utilizes core assemblies CC and DD for unit 2, EE for unit 3, and FF for unit 9. Range IX utilizes core assemblies GG and HH for unit 2, II' for unit 3, and JJ for unit 9.

It may be seen, from Fig. 9, that the relative positions or locations of the various core assemblies on plate 41, grouped by ranges, correspond to those indicated for each range in Fig. 1.

Although not shown in the drawings, there are several holes in plate 41 in addition to slots 73. Thus, holes may be provided therein, suitably located to enable top-side adjustment of trimmer capacitors in subassemblies 2, 3, and 9. Also, ventilation holes in plate 41 may be provided for subassemblies 3 and 9, which contain hot-cathode vacuum tubes.

The mounting of the right-hand side of rocker plate 41, which permits pivotal movement at this side in response to vertical movement of the left-hand side of the plate, has previously been described. The mounting of the left-hand side of plate 41, which permits pivotal movement at this side in response to vertical movement of the right-hand side of the plate (by cams 42, 42' and push rods 55, 55'), will now be described. A rod 85, which will hereinafter be referred to as the band stop rod, is mounted (see Fig. 5) on the left side wall 52 of the framework, substantially centrally (front-to-rear) thereof. Rod 85 is mounted for vertical sliding movement with respect to the frame, sliding for example in a bearing 86 provided in side wall 52. Rigidly secured to the upper end of rod 85, for example by being bolted thereto, is a bracket 87 which is of C-shape in cross-section and which has a downwardly-extending tab 87*a* at its front end and a downwardly-extending tab 87*b* at its rear end. Tabs 87*a* and 87*b* are each provided with a socket adapted to receive a ball therein. Rocker plate 41 has integral therewith (see Fig. 9) two more or less cylindrical ear portions 41*a* and 41*b* which extend outwardly or to the left of the left side of the rest of the plate. Ear 41*a* is located in front of the front-to-rear center line of plate 41, immediately adjacent to and aligned with front tab 87*a*, while ear 41*b* is located in back of the front-to-rear center line of plate 41, immediately adjacent to and aligned with rear tab 87*b*. Ears 41*a* and 41*b* are each provided with a socket adapted to receive a ball therein, the socket in ear 41*a* facing the socket in 87*a* and receiving the same ball received by the socket in 87*a*, and the socket in ear 41*b* facing the socket in 87*b* and receiving the same ball received by the socket in 87*b*. Due to this ball-and-socket connection between bracket 87 and ears 41*a* and 41*b*, the left-hand side of rocker plate 41 is pivotally connected to bracket 87 and pivotal movement at this left-hand side is permitted in response to vertical movement of the right-hand side of the rocker plate (by cams 42, 42' and push rods 55, 55'). At the same time, the left-hand side of the rocker plate may be made to move vertically with respect to the framework, since vertical movement of rod 85 moves bracket 87 fastened thereto, and this vertical movement is transmitted through the hinged connection including ears 41*a* and 41*b*, to the left-hand side of the rocker plate 41. Since bracket 87 is rigidly secured to rod 85, these two items move upwardly and downwardly together, essentially as a single member.

In the normal (tripped) position of the rocker plate 41 (illustrated in Fig. 10), the lower end of band stop rod 85 rests on one of a plurality of pins 44 which are fastened to and project rearwardly from a band stop cam 45 which is in turn fastened to an outer hollow shaft 88 journaled for rotation in a rear bearing 89 mounted on the left side wall 52 and in a front bearing 90 mounted on the front brace 53. Thus, cam 45 is free to rotate with respect to the framework, carrying the pins 44 along with it. The height of the left-hand side of rocker plate 41 is thus controlled by the plurality of pins 44 on band stop cam 45. The lower end of band stop rod 85 is flattened to provide a more effective (smaller in total area and elongated) bearing surface for this end, on pins 44. As may be seen in Fig. 5, there are thirty pins 44 fastened to cam 45, one pin for each of the thirty bands in the above table. These pins are located at various radial distances from the axis of shaft 88, according to the particular height of the left-hand side of the rocker plate 41 which is appropriate to tuning over the respective band according to the above table, and the radial distance of each pin from such axis may be adjusted over a small range for alignment purposes by suitable means, not shown. The left-hand side of rocker plate 41 is capable of a maximum vertical excursion of one inch, from the pin 44 radially closest to the axis of shaft 88 to the pin 44 radially furthest from such axis.

The band switch knob 47 is secured to a band switch shaft 91 which is the inner solid shaft passing through the hole in hollow outer shaft 88. Shaft 91 extends the entire length (front to rear) of the framework and is journaled for rotation in various bearings, one secured to a front cover plate 92, one secured to left side wall 52, and one secured to the rear brace 54 of the framework. Shaft 91 drives shaft 88 (and also cam 45 fastened thereto) through a mechanical connection indicated schematically at 46. This mechanical connection 46 includes a gear train (to be described in more detail hereinafter) having a ratio of 15:1, fifteen revolutions of knob 47 and shaft 91 causing one revolution of shaft 88 and cam 45. As will be explained hereinafter, band switch positions are provided, by means of a detent mechanism, every 180° of rotation of knob 47, so that fifteen revolutions of this knob correspond to thirty positions (thirty pins 44) spaced around the edge of band switch or band stop cam 45 (360° of rotation of this cam).

Tuning shaft 58, like shaft 91, is journaled for rotation with respect to the framework, by means of various bearings, one secured to cover plate 92, and one secured to the front brace 53 of the framework.

Figure 10:
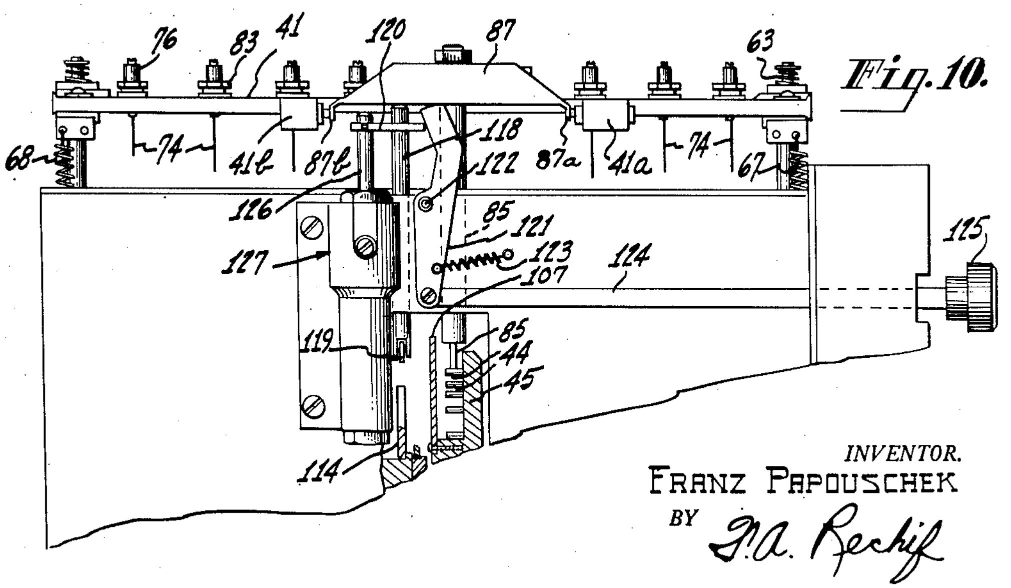
Fig. 10 is a partial side view similar to Fig. 7, but showing the rocker plate in another position.

The left-hand side of rocker plate 41 is urged to the position illustrated in Fig. 10 (tripped position, in which the lower end of rod 85 rests on one of the band switch pins 44) by means of a tension spring 93 (see Fig. 5) one end of which is fastened to a bracket 94 provided on right side wall 51, near the bottom thereof and substantially centrally (front to rear) thereof. This spring passes diagonally upwardly from right to left of the framework, centrally (front to rear) thereof (see Figs. 5 and 11), and the upper end of the spring is attached to one end of a cable 95 which passes upwardly over a pulley 96. The other end of cable 95 passes through a small aperture in rocker plate 41 and is secured to an enlarged member 97 which bears against the upper surface of plate 41 and thus the left-hand side of rocker plate 41 is urged downwardly by spring 93. Pulley 96 is journaled for rotation by means of a bracket 98 secured to the outer surface of bearing 86.

Figure 11:
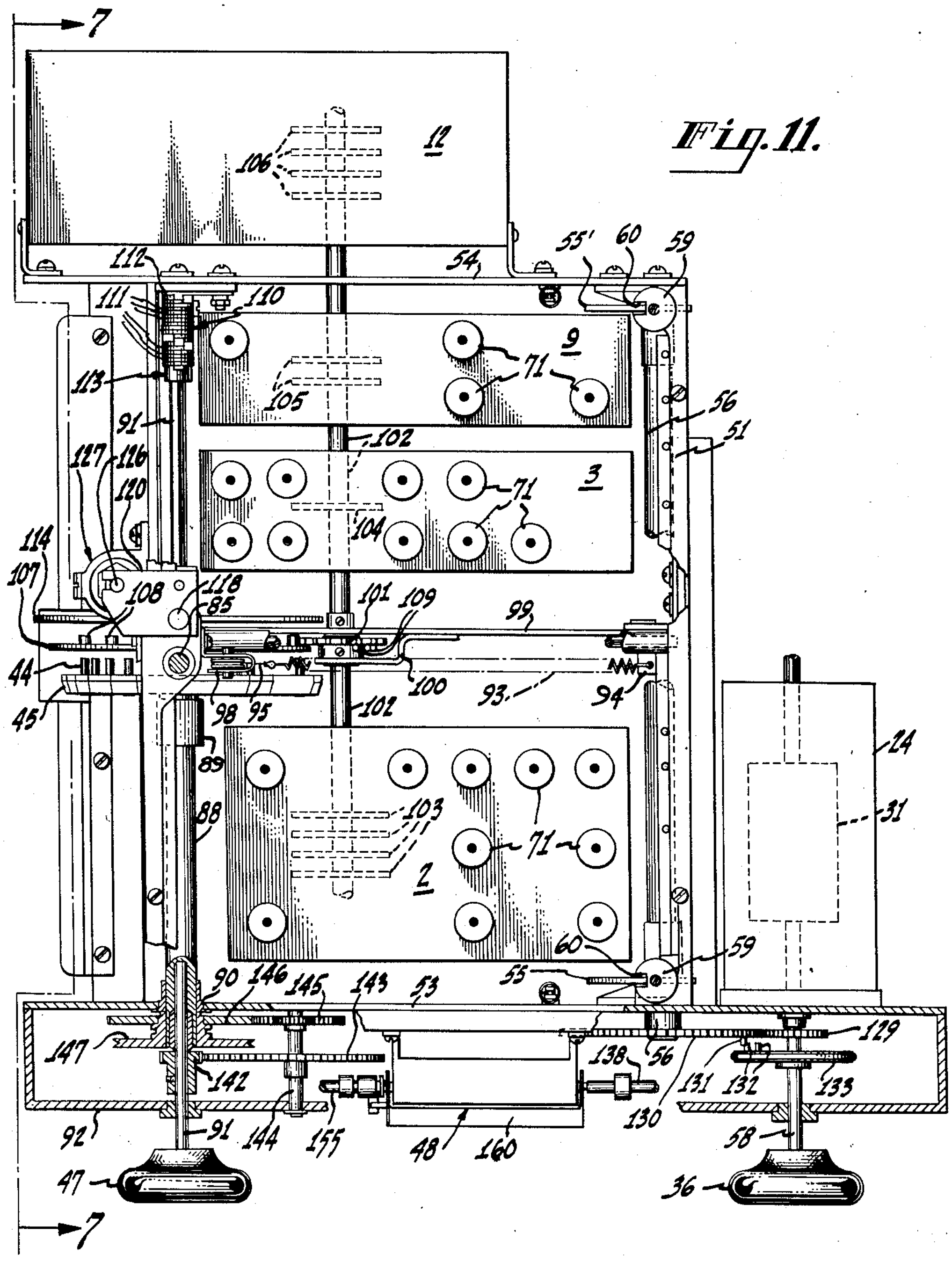
Fig. 11 is a top view of an assembled receiver, with the rocker plate removed.

An elongated supporting bar member 99 is firmly secured at one end to bracket 94 and at its opposite end to the outside of one of the bearings which support shafts 88 and 91, that bearing which is near the center (front to rear) of the framework. Bar 99 thus extends entirely across the framework, from left to right, with the left end of the bar being somewhat higher than the right end thereof. Slightly to the left of the center of the length of bar 99, a bracket 100 is fastened thereto and extends frontwardly from bar 99 and then parallel thereto to provide, with bar 99, a pair of spaced, aligned bearings in which is journaled for rotation a gear wheel 101 which constitutes the driven gear of the Geneva movement 50 for driving range switch 49. A shaft 102 is secured to gear wheel 101 to be driven thereby and this shaft has mounted thereon a total of eleven rotary contactors each associated with a respective switching wafer to constitute the range switch 49. The shaft 102 is made of insulating material and has two sections, one section extending frontwardly from wheel 101 and the other section extending rearwardly from wheel 101. As illustrated in Fig. 11, there are four rotary contactors on shaft 102 and four associated switching wafers 103 mounted in and electrically connected to subassembly 2. These contactors and switching wafers 103 are used to switch into the circuit various coils such as 4 and 5 in antenna unit 2, one pair of coils being switched into the circuit for each respective one of the ranges I through IX. There is one additional rotary contactor on shaft 102 and one associated switching wafer 104 mounted in and electrically connected to subassembly 3. This contactor and switching wafer 104 is used to switch into the circuit coils such as 7 in R. F. unit 3, one coil being switched into the circuit for each respective one of the ranges I through IX. There are two additional rotary contactors on shaft 102 and two associated switching wafers 105 mounted in and electrically connected to subassembly 9. These contactors and switching wafers 105 are used to switch into the circuit various coils such as 11 in oscillator unit 9, one coil being switched into the circuit for each respective one of the ranges I through IX.

An I. F. unit subassembly 12 is mounted externally and rearwardly of the main framework (since no permeability tuning of coils is needed in this unit), by means of suitable angle brackets, in such a position that shaft 102 can operate switching wafers in this unit. There are four additional rotary contactors on shaft 102 and four associated switching wafers 106 mounted in and electrically connected to subassembly 12. These contactors and switching wafers 106 are used to switch the connections and/or to switch capacitors in unit 12, as required by the above table.

Pinned to the rear of band switch cam 45, so as to rotate therewith and with the outer (slower speed) shaft 88, is a disc 107 which serves as the driving gear of the Geneva movement 50. Disc 107 is substantially circular in outer configuration. This disc carries a plurality (for example, eight in number) of angularly spaced pins 108 which extend rearwardly from the rear face of the disc and are adapted to ride in the notches between the projecting teeth on gear wheel 101, to drive the latter intermittently as disc 107 rotates. Thus, intermittent actuation of the range switch 49 (the switch shaft 102 of which is driven by gear wheel 101) is provided, as required by the above table. This intermittent actuation is effected by the rotation of band switch knob 47, which rotates shaft 88 (through a gear train) and thereby also disc 107.

A plurality of stop pins 109 are mounted on gear wheel 101, to project forwardly of the front face thereof (see Fig. 11). These pins serve as a detent arrangement, to prevent accidental or undesired rotation (such as might occur, for example, when the receiver is being serviced) of gear wheel 101, by engaging the outer circular periphery of disc 107 (to thereby produce a binding action) at the times when none of the spaced pins 108 are in engagement with wheel 101. Small recesses such as 110 are provided in the periphery of disc 107, in radial alignment with certain of the pins 108, to receive the pins 109 and permit desired rotation of gear wheel 101 by pins 108, when such latter pins in their angular rotation come into engagement with the notches between the teeth in gear wheel 101.

The inner shaft 91, about midway from front to rear of the framework and rearwardly of disc 107, is connected by means of a shaft coupling to another shaft which extends to the rear brace 54 of the framework, is journaled therein, and which may be considered to be integral with shaft 91. At the rear end of shaft 91, adjacent the rear brace 54, there is provided a wind-up detent mechanism 110 which acts in effect to stop the rotation of shaft 88 before the first band (represented by one of the pins 44), in one direction, and after the thirtieth band (represented by another of the pins 44), in the other direction. In other words, this mechanism 110 acts in effect to prevent rotation of shaft 88 through more than 360°, in either direction. Mechanism 110 comprises a series (illustrated as eighteen in number) of washers 111 which are mounted loosely on shaft 91, between a rear plate 112 secured to rear brace 54 and a collar 113 fastened (as by means of a set screw) to shaft 91. Each of the elements 111 and 112 has a bent ear portion which extends forwardly of the main plane of the respective element, while collar 113 has a straight upstanding ear portion. As shaft 91 is rotated in one direction, the ear on collar 113 engages the ear on the immediately adjacent washer 111 and carries this washer around until its ear engages the ear of the next adjacent washer 111, carrying it around in turn, and so on, the rotation in this direction being stopped when the ear on the rearmost washer 111 engages the ear on the fixed plate 112. When shaft 91 is rotated in the opposite direction, the action is quite similar, except that the washers 111 are successively carried around in the reverse direction. The action of the detent or stop mechanism 111 is such that rotation of band switch shaft 91 is limited to approximately fifteen revolutions in either direction.

Figure 7:
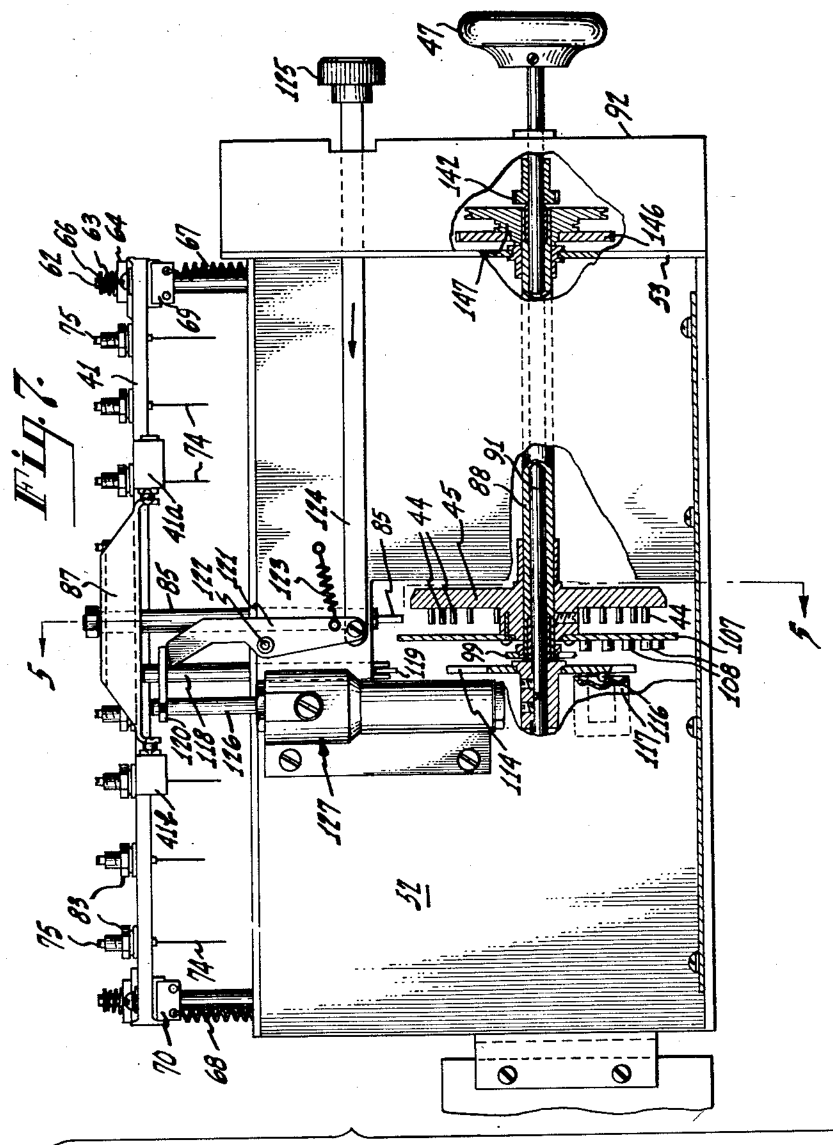
Fig. 7 is a side view of the tuning structure of the invention, certain parts being broken away, this view being taken along line 7—7 of Fig. 11.

A mechanical lift is provided by the operation of band switch knob 47 which locks the left-hand side of rocker plate 41 in a position sufficiently high so that the lower end of rod 85 will clear that one of the pins 44 which is furthest radially from the axis of shaft 88. This prevents any binding of rod 85 on pins 44 as cam 45 is turned. This lift action occurs each time the band switch selection is changed, and the left-hand side of the rocker plate is locked in this extreme upper position until the desired band is selected, at which time the mechanism may be tripped to release the rocker plate so that the lower end of rod 85 can fall onto the particular pin 44 which has been rotated to a position immediately thereunder. This lift and tripping mechanism will now be described. The mechanism is particularly illustrated in its extreme upper, locked position in Figs. 5 and 7, and in its released, operative normal position in Fig. 10.

A butterfly cam 114 is fastened to the inner band switch shaft 91 and is located just rearwardly of the left end of the supporting bar 99. This cam is thus rotated directly from the band switch knob 47. Cam 114 has two recesses 115 therein positioned 180° apart, these recesses being provided in the rear surface of the cam plate and being radially aligned with the two minimum-diameter points of the cam. A spring-biased ball 116 is mounted in a bracket 117 fastened to and extending inwardly from left side wall 52 (see Fig. 7) in such a position that the ball can seat in each of the recesses 115 in cam 114, as the latter is rotated, thus providing a detent (band switch) position every 180° of rotation of cam 114, or every 180° of rotation of knob 47, since cam 114 and knob 47 are secured to the same shaft 91.

A push rod 118, having a roller 119 journaled in the bottom end thereof, is mounted for vertical movement in a suitable bearing provided in left side wall 52. The roller 119 is positioned to engage the cam surface of butterfly cam 114 as the latter is rotated, when the plate 41 is in its normal, tripped position (see Fig. 10). Push rod 118 is positioned directly in back of band stop rod 85 and the former is adapted to contact the lower surface of hinge bracket 87. Assuming that the rocker plate 41 is in the tripped position of Fig. 10, rotation of band switch knob 47 causes corresponding rotation (with the same angular velocity) of butterfly cam 114, and as this cam rotates, due to its shape it engages roller 119 and moves push rod 118 upwardly. Push rod 118, moving upwardly, engages the lower surface of hinge bracket 87 and pushes the left-hand side of rocker plate 41 upwardly, by means of ear portions **41*a* and 41*b* integral with plate 41. As the bracket 87 moves upwardly, it carries with it the band stop rod 85, which rod is bolted to the bracket. Thus, the lower end of rod 85 is carried upwardly, above pins 44 on which this lower end rests in the tripped position of the mechanism. The left-hand side of rocker plate 41, after being pushed up by butterfly cam 114 acting on push rod 118**, is locked in this upper position (by mechanism to be hereinafter described) until the desired band is selected.

A plate 120 which is substantially rectangular in outline (see Fig. 11) is rigidly secured to push rod 118 near the upper end thereof, the rod 118 being secured near one corner of the plate and the plate extending to the left (as seen from the front of the receiver) beyond the left side wall 52 of the framework. A trip lever 121 is pivotally mounted at 122 to the left side wall 52 of the framework, this pivotal mounting being approximately midway of the length of the lever. Lever 121 is so positioned that the curved upper end thereof can swing under plate 120 in the locked position of the mechanism (see Fig. 7), the lever 121 firmly engaging the under side of plate 120 in this position to keep the push rod 118, and the bracket 87 and thus the band stop rod 85, in an elevated position in which the lower end of this latter rod clears all of pins 44 as cam 45 is rotated. A tension spring 123, one end of which is fastened to lever 121 and the other end of which is fastened to side wall 52, resiliently urges the upper end of lever 121 in a counter-clockwise direction, so that it is urged to swing under plate 120 (that is, to the locked position illustrated in Fig. 7) when push rod 118 (and plate 120 secured thereto) are moved upwardly by the rotation of butterfly cam 114, in the manner previously described. The amount of lift of rod 85 and the left-hand side of rocker plate 41 provided by butterfly cam 114 is such that, in the locked position of Fig. 7, the lower end of rod 85 will clear the highest pin 44 (that is, the pin radially furthest from the axis of shaft 88). Also, the upper end of trip lever 121 is so designed or curved that, when the upper end thereof swings under plate 120 (in the locked position, Fig. 7), the push rod 118 is held high enough so that the roller 119 at its bottom end clears the highest point of the butterfly cam 114 as the latter is rotated thereunder. A trip rod 124 is pivotally connected to the lower end of trip lever 121, extends to the front of the framework, and carries a trip button 125 at its free, front end. When button 125 is pushed, rod 124 moves rearwardly of the framework and causes trip lever 121 to pivot about 122, moving the upper end of lever 121 in the clockwise direction against the tension of spring 123.

Assuming that it is desired to change the band to which the receiver is tuned, knob 47 is turned. This causes rotation of shaft 91 and butterfly cam 114, lifting the left-hand side of rocker plate 41 by means of push rod 118. As plate 120 moves upwardly, the upper end of trip lever 121 moves thereunder due to the force of spring 123, to the position illustrated in Fig. 7. This is the locked position, in which rod 85 is held above and clear of all of pins 44. When the band switch knob 47 has been rotated to bring the desired one of pins 44 under rod 85, trip button 125 on the front panel is pushed. The upper end of trip lever 121 then moves clockwise, out from under plate 120, tripping or releasing the mechanism so that rocker plate 41 and band stop rod 85 move downwardly (under the force of spring 93) until the lower end of rod 85 engages that one of the pins 44 which is positioned directly beneath. This position, in which the rocker plate 41 and stop rod 85 are released onto the selected pin 44 on band switch cam 45, is the normal, tripped position and is illustrated in Fig. 10. The locking of the rocker plate 41 in its upper position (the Fig. 7 position) operates a switch (not shown), for example by means of the vertical motion of the left-hand side of the plate, to turn on a warning light on the front panel of the receiver. This warning light serves as a reminder to the operator that the tripping operation just described must be performed before the receiver can be operated.

Near that corner of plate 120 which is diagonally opposite to rod 118, there is secured the operating rod 126 of a dashpot 127 which is suitably mounted on left side wall 52 of the framework. This dashpot is a one-way device, allowing substantially unimpeded upward movement of rod 126 but permitting only slow downward movement thereof. When the trip button 125 is operated, therefore, dashpot 127, through rod 126, plate 120, and rod 118, causes the plate 41 and rod 85 to move downwardly only relatively slowly, and prevents the rocker plate 41 and rod 85 from slamming downwardly onto pin 44, which slamming might affect the alignment of the receiver. As previously described, the spring 93 resiliently urges the left-hand side of rocker plate 41 downwardly.

The variable oscillator 31 is mounted at the right-hand side of the receiver, externally of the main framework, in back of front brace 53, and is aligned with tuning shaft 58 so as to be driven directly therefrom, in order to eliminate backlash. See Figs. 2 and 11. Thus, the tuning shaft 58 itself comprises the mechanical connection 35 to the variable oscillator 31. Located directly in back of variable oscillator 31, and also driven from tuning shaft 58, is the mechanical connection 33, 34 which comprises a worm-gear-and-wheel arrangement for driving the two cores (only one of which, core 128, is illustrated in Fig. 2) which permeability tune the coils 28 and 29 in the tunable band pass filter of the control unit 21.

The 11:1 ratio gear train coupling tuning shaft 58 to camshaft 56 comprises a small gear 129 fastened to shaft 58, and meshing with and driving a large gear 130 which is fastened to shaft 56. In order to limit the rotation of shaft 56 to somewhat less than 360°, actually to 10/11 of 360°, a stop pin 131 is fastened to the front face of gear 130. Pin 130 is arranged to engage either one of two pins 132 which are mounted on the rear face of a pulley 133 fastened to shaft 58. At one limit of the rotation of shaft 56, pin 131 engages one of the two pins 132, thus preventing any further rotation of shaft 56, and at the other limit of the rotation of this shaft, pin 131 engages the other of the two pins 132.

Figure 6:
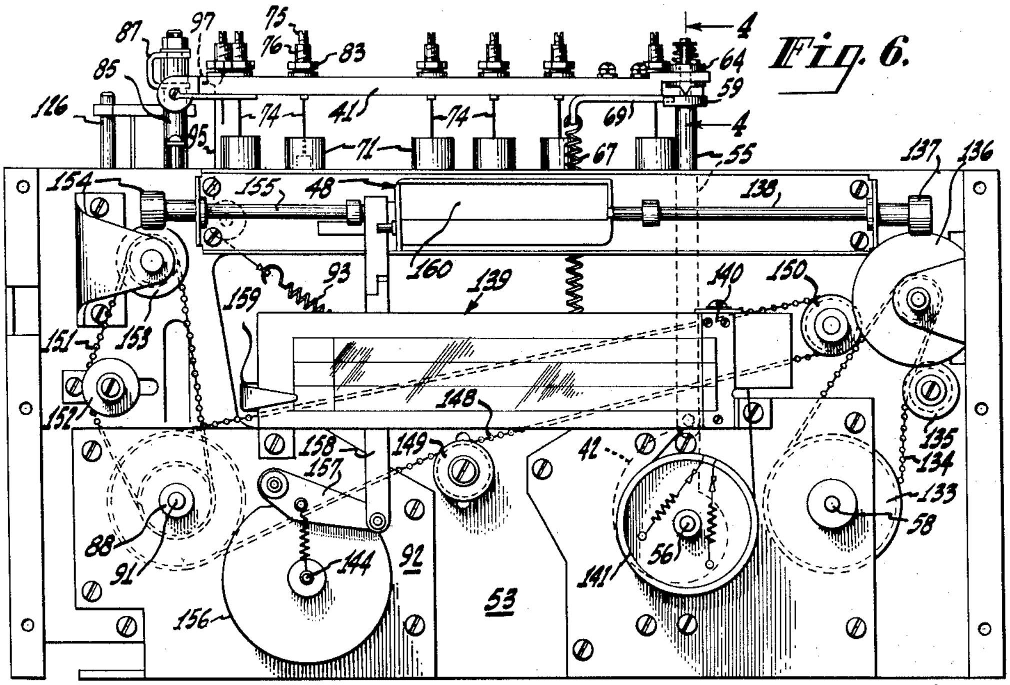
Fig. 6 is a front elevation of an assembled receiver, illustrating the tuning device of this invention.

As previously described in connection with Fig. 1, the counter 48 has two sections, an mc. section (the left-hand two dials on the counter) and a kc. section (the right-hand three dials on the counter). The right-hand three dials of counter 48 are driven from tuning shaft 58 (see Fig. 6). This drive is from pulley 133 on shaft 58, which by means of a bead chain 134 passing over an idler pulley 135, drives a pulley fastened to a worm wheel 136. Worm wheel 136 in turn drives a worm 137 fastened to the right-hand shaft 138 of the counter 48, which drives the right-hand three dials of the counter.

It may be noted, from the above table, that ranges I, II and III (bands 1, 2 and 3) do not cover one mc. each, as do each of bands 4 through 30. Consequently, these lower three bands cannot be represented by a counter. These bands each have their own separate dial scale, the three dial scales being arranged in a unit 139. The slider 140 for the dial scales is driven from a dial cord pulley or dial drive pulley 141 fastened to camshaft 56.

The 15:1 ratio gear train coupling band switch shaft 91 to shaft 88 (which drives cam 45 and disc 107) will now be described. A small gear 142 secured to shaft 91 meshes with and drives a large gear 143 secured to a parallel shaft 144. A small gear 145 fastened to shaft 144 meshes with and drives a large gear 146 secured to shaft 88.

A pulley 147, having two driving rim portions of different diameters, is fastened to shaft 88 to be driven therefrom. A bead chain 148 passes around the larger-diameter portion of pulley 147 (see Fig. 6), thence over an idler pulley 149 and around a pulley 150 which is secured to the shaft of the harmonic selector switch 24. Harmonic selector switch 24 is mounted at the right-hand side of the receiver, externally of the main framework, in back of front brace 53, and above variable oscillator 31 (see Fig. 11). In this way, the harmonic selector switch 24 is driven from the band switch shaft 91, through the gear reduction train.

The left-hand two dials of counter 48 are driven from band switch shaft 88. This drive is from the smaller-diameter portion of pulley 147 on shaft 88, which by means of a bead chain 151 passing over an idler pulley 152, drives a pulley fastened to a worm wheel 153. Worm wheel 153 in turn drives a worm 154 fastened to the left-hand shaft 155 of the counter 48, which drives the left-hand two dials of the counter.

A cam disc 156 is fastened to shaft 144, which is a shaft operating in the gear train connecting band switch knob 47 to band switch shaft 88 and band switch cam 45. A pivotally-mounted and spring-biased cam follower 157 is arranged to ride on the cam surface of disc 156, and one end of an arm 158 is pivotally connected to cam follower 157 at the end thereof which is remote from the pivotal connection of this follower to front plate 92. Arm 158 is constrained to move vertically by any suitable means (not shown) and is arranged to move a pointer 159 and a shield or cover 160. Pointer 159 is positioned at the left-hand side of dial scale unit 139 and cooperates selectively with the three dial scales of this unit. Cover 160 is a shield which selectively covers all the dials of the counter 48. Cam 156 is so designed as to move arm 158 and pointer 159 upwardly in more or less stepwise fashion, as shaft 144 rotates, for three steps corresponding respectively to the three dial scales of unit 139 and to the three lowest bands, and then on the fourth step (corresponding to the fourth band) to move the pointer above the topmost dial scale, holding the pointer in this position for the remainder of the rotation of cam 156. The shield 160 covers the dials of counter 48 when the receiver is switched to any of the three lowest bands, and when the receiver is switched to any of bands 4 through 30, cam 156 moves arm 158 and cover 160 in such a way as to uncover the dials of counter 48. Ranges I, II and III (bands 1, 2 and 3) do not cover one mc. each, and consequently cannot be represented by a counter. For these ranges and bands, the three dial scales of unit 139 are respectively utilized, the particular band to which the receiver is switched being indicated by the pointer 159. The shield 160 covers the counter 48 when the receiver is switched to any one of these three lowermost bands, thus avoiding any ambiguity as to the frequency to which the receiver is tuned.

Figure 12:
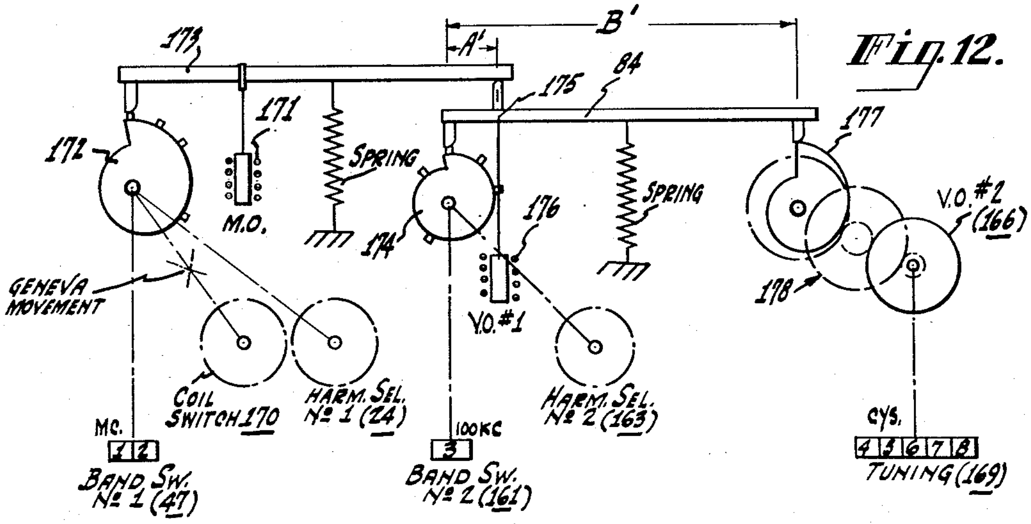
Fig. 12 is a diagrammatic view of a mechanical construction illustrating an extension of the idea of the invention.
Figure 13:
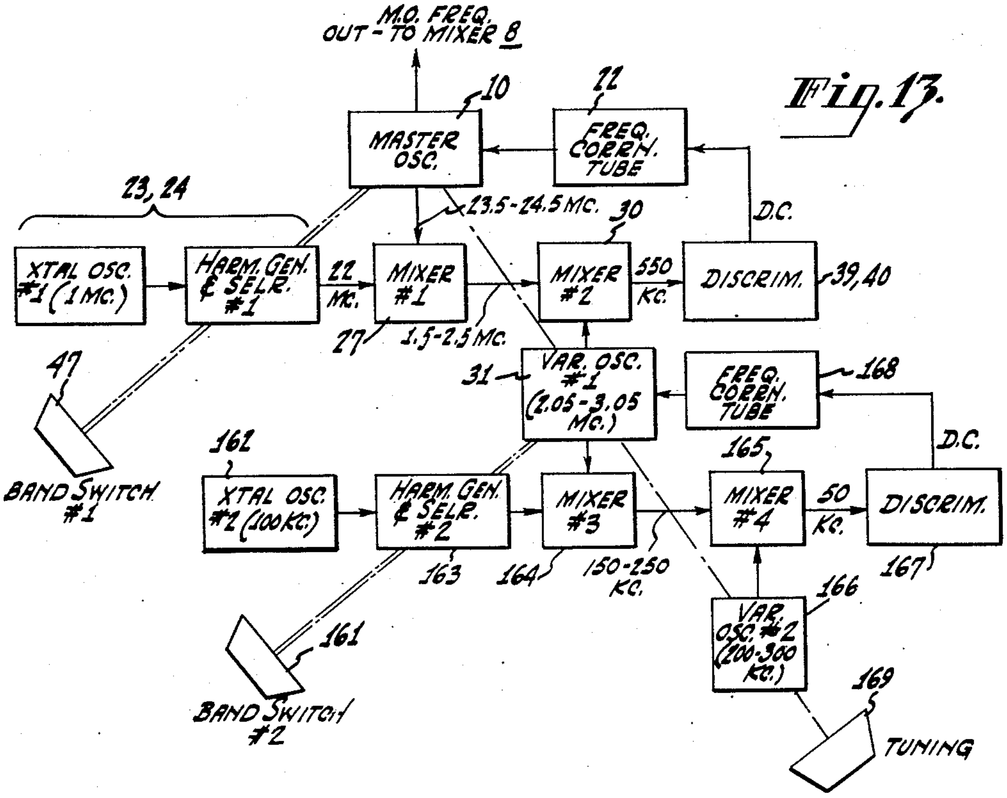
Fig. 13 is a block diagram of a portion of a receiver utilizing the arrangement of Fig. 12.

An extension of the captive oscillator system illustrated in Fig. 1, is illustrated in Figs. 12 and 13, wherein Fig. 12 is a diagrammatic representation of a mechanical tuning system for the cascaded captive oscillator system shown in block diagram form in Fig. 13.

Reference will first be made to Fig. 13. The upper part of this block diagram is substantially identical to that illustrated in Fig. 1. The master oscillator 10 is a captive oscillator. Items 23 and 24 include a one-mc. crystal oscillator, a harmonic generator, and a harmonic selector switch 24 operated by the band switch 47. Mixer 27 receives waves from mast oscillator 10 and from the harmonic generator and selector 23, 24. In Fig. 13, typical values are given for the frequencies out of the various units, for a particular adjustment of the various tuning means. For the master oscillator frequency band of 23.5 to 24.5 mc., the harmonic frequency selected from unit 23, 24 is 22 mc., and the output of No. 1 mixer 27 covers the frequency band of 1.5 to 2.5 mc. No. 2 mixer 30 is receptive of waves from No. 1 variable oscillator 31 and from mixer 27 to produce waves having a fixed frequency of 550 kc. which are applied to tuned discriminator 39, 40; the D. C. output of the discriminator is applied to the frequency correction tube (reactance tube) 22 which corrects the master oscillator. The band switch 47 operates the harmonic selector switch in unit 23, 24 just as in Fig. 1, and also tunes the master oscillator 10 to various bands, as in Fig. 1.

The system of Fig. 13 is a cascaded captive oscillator system. That is, in the Fig. 13 system the variable oscillator 31 is replaced by a captive one, and the system for effecting this is basically similar to the first captive oscillator system. The captive variable oscillator 31 has a total frequency range of one mc. and is switched in 100-kc. steps by the No. 2 band switch 161. Therefore, the system of Fig. 13 is equivalent to a decade switching system, since the master oscillator 10 is switched by the band switch 47 in one-mc. steps, along with the harmonic selector switch 24. Thus, when using a counter for band indication, mc. and 100 kc. numbers can be switched independently.

For the captive variable oscillator 31, a crystal oscillator 162 operating at 100 kc. feeds this frequency into a harmonic generator and selector 163 which includes a harmonic selector switch operated by the band switch 161. A mixer 164 receives waves from variable oscillator 31 and from the harmonic generator and selector 163. The output of mixer 164, for a particular tuning adjustment, may cover the frequency band of 150 to 250 kc. No. 4 mixer 165 is receptive of waves from mixer 164 and from a variable oscillator 166 (tunable over a range of 200 to 300 kc.) to produce waves having a fixed frequency of 50 kc. which are applied to a tuned discriminator 167; the D. C. output of discriminator 167 is applied to a frequency correction tube (reactance tube) 168 which corrects the variable oscillator 31.

Provision is made (as will be described hereinafter in connection with Fig. 12) to tune the variable oscillator 31 and the master oscillator 10 simultaneously with the variable oscillator 166 within the 100 kc. tuning range of variable oscillator 166, by means of a tuning knob 169. In Fig. 13, two captive systems (one for master oscillator 10 and one for variable oscillator 31) are cascaded electrically.

Now referring to Fig. 12, a mechanical tuning arrangement for the cascaded captive oscillator system of Fig. 13 is illustrated. Two of the mechanical tuning systems diagrammatically illustrated in Fig. 1 (and described in detail in connection with Figs. 2–11) are cascaded mechanically. The No. 1 band switch 47, through a Geneva movement, drives a coil switch 170 for switching the coils in master oscillator 10. The switch in the No. 1 harmonic selector 24 is driven from the shaft of band switch 47. On the left-hand side of Fig. 12 there is illustrated the master oscillator tuning system, with the permeability-tuned coil 171, the lift cam (band switch cam) 172 and the rocker plate 173. As in Fig. 1, the slugs or cores for the respective coils such as 172 are each located along rocker 173 at a distance from the left end of the rocker which is the total length of the rocker plate (from left to right) divided by the number of bands covered by the respective coil. The right-hand end of rocker plate or bar 173 rests on another bar or rocker plate 84 which belongs to the No. 1 variable oscillator 31 captive system. Another cam 174 lifts the bar on rocker 84 so as to move point 175, where the No. 1 variable oscillator coil 176 is located, in 100 kc. steps, there being also 100 kc. steps for the master oscillator. The cam 174 is driven from No. 2 band switch knob 161 and is located at a convenient distance A′ from point 175. The switch in the No. 2 harmonic selector 163 is also driven from band switch knob 161. A third cam 177 is located at a distance B′ from cam 174, in order to provide a tuning within the 100 kc. range. The variable oscillator 166 is mounted directly on the shaft of tuning knob 169, which drives the cam 177 by means of a gear train 178 having a ratio of 1:10, ten revolutions of knob 169 causing one revolution of cam 177.

Assuming a core-travel of one inch at the right-hand end (point 175) of bar 173, 0.1-inch lift on point 175 corresponds to 100 kc. for each master oscillator coil, since each master oscillator coil tunes the master oscillator over a band one mc. wide. The coil 176 for No. 1 variable oscillator 31 is located at point 175, and the total travel for this coil is also one inch, corresponding to one mc., since variable oscillator 31 tunes over a range of one mc. For convenience, the travel on the cam 177 is also one inch, and therefore the coil 176 of variable oscillator 31 is tuned in 100 kc. steps, provided that B′ is ten times A′.

The shafts of knobs 47, 161 and 169 each drive a counter, and mc., 100 kc., and 10,000 cycles can be adjusted independently of each other. A dial can be used instead of the 10,000-cycle counter, and 100 cycles would correspond to 3.6 degrees of rotation of the shaft of tuning knob 169.

Each band can be aligned mechanically with screws, the 1-mc. band on cam 172, and the 100-kc. band on cam 174.

The range of each coil may be aligned by moving the support of the core or slug along the bar 173 (for example, in the same manner previously set forth in the description of Figs. 2–11), in order to take care of core and mechanical tolerances.

If more convenient, the bar 84 can be located with the cam 177 on the left side.

The mechanical and electrical system of Figs. 12 and 13 can be extended by one more decade, in order to subdivide the whole range into ten kc. steps, providing three independent band switches, and resulting in a ten-cycle readability. Each variable oscillator would correct the previous one electrically, and the tuning device would provide a tuning of all coils involved.

What is claimed is:

1. In a multiband radio receiver the tuning coverage of which is separated into ranges and bands, a plurality of tuning elements each of which covers one of said ranges, an elongated member, means mechanically coupling said elements to said member, a support, means positioned adjacent each end of said member for adjustably mounting said member on said support for movement toward and away from the same, means for moving and adjustably positioning one end of said member with respect to said support, range switching means mechanically coupled to said last-named means by way of an intermittent coupling, said switching means operating to switch from one of said plurality of elements to another, and means for moving and adjustably and independently positioning the other end of said member with respect to said support.

2. In a multiband radio receiver the tuning coverage of which is separated into ranges and bands, a plurality of tuning elements each of which covers one of said ranges, an elongated member, means mechanically coupling said elements to said member, the distance between the point of coupling of each respective one of said tuning elements to said member and one end of said member being inversely proportional to the number of bands covered by the respective tuning element, a support, means positioned adjacent each end of said member for adjustably mounting said member on said support for movement toward and away from the same, band switching means for moving and adjustably positioning said one end of said member in stepwise fashion with respect to said support, range switching means operated intermittently from said band switching means to switch from one of said plurality of elements to another, and tuning means for moving and adjustably and independently positioning the other end of said member with respect to said support.

3. In a multiband radio receiver the tuning coverage of which is separated into ranges and bands, tuning mechanism comprising a support, a pair of spaced push-rods mounted for sliding movement in said support, an elongated member pivotally connected at its ends to the respective rods, whereby the two ends of said member may be independently moved toward and away from said support by means of said rods, band switching means for moving and adjustably positioning one of said rods with respect to said support, a plurality of movable tuning elements of which covers one of said ranges, means mechanically coupling said elements to said member to be moved thereby, range switching means operated intermittently from said band switching means to switch from one of said plurality of elements to another, and tuning means for moving and adjustably positioning the other of said rods with respect to said support.

4. In a multiband radio receiver the tuning coverage of which is separated into ranges and bands, tuning mechanism comprising a support, a pair of spaced push-rods mounted for sliding movement in said support, an elongated member pivotally connected at its ends to the respective rods, whereby the two ends of said member may be independently moved toward and away from said support by means of said rods, band switching means for moving and adjustably positioning one of said rods in stepwise fashion with respect to said support, a plurality of movable tuning elements each of which covers one of said ranges, means mechanically coupling said elements to said member to be moved thereby, range switching means operated intermittently from said band switching means to switch from one of said plurality of elements to another, and tuning means for moving and adjustably positioning the other of said rods in continuous fashion with respect to said support.

5. In a multiband radio receiver the tuning coverage of which is separated into ranges and bands, a plurality of magnetic cores, a separate coil for each of said cores constructed and arranged to be tuned by the movement of the respective core, each core and coil combination covering one of said ranges, an elongated member, means mechanically coupling said cores to said member, a support, means positioned each end of said member for adjustably mounting said member on said support for movement toward and away from the same, band switching means for moving and adjustably positioning one end of said member with respect to said support, range switching means operated intermittently from said band switching means to switch from one of said coils to another, and means for moving and adjustably and independently positioning the other end of said member with respect to said support.

6. In a radio receiver, an input unit, a radio frequency unit, and a mixer unit coupled in cascade, said mixer unit including a local heterodyne oscillator; separate tuning elements for tuning said input unit, said radio frequency unit, and said oscillator, an elongated member, means mechanically coupling said elements to said member, a support, means positioned adjacent each end of said member for adjustably mounting said member on said support for movement toward and away from the same, means for moving and adjustably positioning one end of said member with respect to said support, a control unit for said oscillator including another oscillator having a tuning element tunable over a small frequency range; means for moving and adjustably and independently positioning the other end of said member with respect to said support, and means operated from said last-mentioned means and independent of said elongated member and of said support for varying said last-named tuning element.

7. In a radio receiver, an input unit, a radio frequency unit, and a mixer unit coupled in cascade, said mixer unit including a local heterodyne oscillator; separate tuning elements for tuning said input unit, said radio frequency unit, and said oscillator, an elongated member, means mechanically coupling said elements to said member, a support, means positioned adjacent each end of said member for adjustably mounting said member on said support for movement toward and away from the same, means for moving and adjustably positioning one end of said member with respect to said support, a control unit for said oscillator including a harmonic selector switch and also including another oscillator having a tuning element tunable over a small frequency range; means for operating said selector switch from said last-mentioned means, means for moving and adjustably and independently positioning the other end of said member with respect to said support, and means operated from said last-mentioned means and independent of said elongated member and of said support for varying said last-named tuning element.

8. In a multiband radio receiver the tuning coverage of which is separated into ranges and bands, an input unit, a radio frequency unit, and a mixer unit coupled in cascade, said mixer unit including a local heterodyne oscillator; a first plurality of tuning elements equal in number to the total number of ranges for tuning said input unit, a second plurality of tuning elements equal in number to the total number of ranges for tuning said radio frequency unit, a third plurality of tuning elements equal in number to the total number of ranges for tuning said oscillator, an elongated member, means mechanically coupling said elements to said member, a support, means positioned adjacent each end of said member for adjustbly mounting said member on said support for movement toward and away from the same, means for moving and adjustably positioning one end of said member with respect to said support, range switching means operated intermittently from said last-named means to selectively switch one element from each of said pluralities of elements into circuit at a time, and means for moving and adjustably and independently positioning the other end of said member with respect to said support.

9. In a multiband radio receiver the tuning coverage of which is separated into ranges and bands, an input unit, a radio frequency unit, and a mixer unit coupled in cascade, said mixer unit including a local heterodyne oscillator; a first plurality of tuning elements equal in number to the total number of ranges for tuning said input unit, a second plurality of tuning elements equal in number to the total number of ranges for tuning said radio frequency unit, a third plurality of tuning elements equal in number to the total number of ranges for tuning said oscillator, an elongated member, means mechanically coupling said elements to said member, a support, means positioned adjacent each end of said member for adjustably mounting said member on said support for movement toward and away from the same, means for moving and adjustably positioning one end of said member with respect to said support, range switching means operated intermittently from said last-named means to selectively switch one element from each of said pluralities of elements into circuit at a time, a control unit for said oscillator including at least one tuning element tunable over a small frequency range; means for moving and adjustably and independently positioning the other end of said member with respect to said support, and means operated from said last-mentioned means for varying said last-named tuning element.

10. In a multiband radio receiver the tuning coverage of which is separated into ranges and bands, an input unit, a radio frequency unit, and a mixer unit coupled in cascade, said mixer unit including a local heterodyne oscillator; a first plurality of tuning elements equal in number to the total number of ranges for tuning said input unit, a second plurality of tuning elements equal in number to the total number of ranges for tuning said radio frequency unit, a third plurality of tuning elements equal in number to the total number of ranges for tuning said oscillator, an elongated member, means mechanically coupling said elements to said member, a support, means positioned adjacent each end of said member for adjustably mounting said member on said support for movement toward and away from the same, means for moving and adjustably positioning one end of said member with respect to said support, range switching means operated intermittently from said last-named means to selectively switch one element from each of said pluralities of elements into circuit at a time, a control unit for said oscillator including a harmonic selector switch and at least one tuning element tunable over a small frequency range; means for operating said selector switch from said moving and positioning means, means for moving and adjustably and independently positioning the other end of said member with respect to said support, and means operated from said last-mentioned means for varying said last-named tuning element.

11. In a radio receiver, a plurality of tuning elements, an elongated member, means mechanically coupling said elements to said member at separate points spaced along the length of said member, a support, means positioned adjacent each end of said member for adjustably mounting said member on said support for movement toward and away from the same, means for moving and adjustably positioning one end of said member with respect to said support, switching means mechanically coupled to said last-mentioned means by way of an intermittent coupling, said switching means operating to connect a respective one of said tuning elements into the circuit of said receiver for each position of said switching means, and means for moving and adjustably and independently positioning the other end of said member with respect to said support.

12. In a radio receiver, tuning mechanism comprising a support, a pair of spaced push-rods mounted for sliding movement in said support, an elongated member pivotally connected at its ends to the respective rods, whereby the two ends of said member may be independently moved toward and away from said support by means of said rods, a plurality of movable tuning elements mechanically coupled to said member at separate points spaced along the length of said member, means for moving and adjustably positioning one of said rods with respect to said support, switching means mechanically coupled to said last-mentioned means by way of an intermittent coupling, said switching means operating to connect a respective one of said tuning elements into the circuit of said receiver for each position of said switching means, and separate means for moving and adjustably positioning the other of said rods with respect to said support.

13. In a radio receiver, a plurality of magnetic cores, a separate coil for each of said cores constructed and arranged to be tuned by the movement of the respective core, an elongated member, means mechanically coupling said cores to said member at separate points spaced along the length of said member, a support, means positioned adjacent each end of said member for adjustably mounting said member on said support for movement toward and away from the same, means for moving and adjustably positioning one end of said member with respect to said support, switching means mechanically coupled to said last-mentioned means by way of an intermittent coupling, said switching means operating to connect a respective one of said tuning elements into the circuit of said receiver for each position of said switching means, and means for moving and adjustably and independently positioning the other end of said member with respect to said support.

14. In radio apparatus including a plurality of signal translating units each tunable through a plurality of frequency ranges: tuning mechanism comprising a support, a pair of spaced push-rods mounted for sliding movement in said support, a rectangular-shaped plate pivotally connected at its opposite sides to the respective rods, whereby the two sides of said plate may be independently moved toward and away from said support by means of said rods, cam means for moving and adjustably positioning one of said rods in a lengthwise direction with respect to said support, separate cam means for moving and adjustably positioning the other of said rods in a lengthwise direction with respect to said support, and a plurality of movable tuning elements mechanically coupled to said plate at spaced points within the boundaries of said plate, so as to be moved in response to movements of said rods and resulting movements of said plate, the number of said elements being at least equal to the number of signal translating units multiplied by the number of frequency ranges and said elements being coupled to said plate in a two-dimensional pattern wherein the cores for each respective range are distributed along one dimension of said pattern and the core groups for the several ranges are distributed along the other dimension of said pattern.

References Cited in the file of this patent

UNITED STATES PATENTS

| | | |
|---|---|---|
| 2,540,824 | Kolks | Feb. 6, 1951 |
| 2,555,391 | Bach | June 5, 1951 |
| 2,568,412 | Robinson | Sept. 18, 1951 |
| 2,679,005 | Bataille et al. | May 18, 1954 |

FOREIGN PATENTS

| | | |
|---|---|---|
| 382,076 | Great Britain | Oct. 20, 1932 |
| 538,389 | Great Britain | July 31, 1941 |
| 432,456 | Italy | Mar. 20, 1948 |
| 704,982 | Great Britain | Mar. 3, 1954 |